US011756854B2

(12) United States Patent
Lin et al.

(10) Patent No.: US 11,756,854 B2
(45) Date of Patent: Sep. 12, 2023

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Yu-Sheng Lin, Hsinchu County (TW); Po-Yao Lin, Hsinchu County (TW); Shu-Shen Yeh, Taoyuan (TW); Chin-Hua Wang, New Taipei (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 28 days.

(21) Appl. No.: 17/367,401

(22) Filed: Jul. 4, 2021

(65) Prior Publication Data

US 2022/0301971 A1     Sep. 22, 2022

Related U.S. Application Data

(60) Provisional application No. 63/163,040, filed on Mar. 18, 2021.

(51) Int. Cl.
*H01L 23/367*     (2006.01)
*H01L 25/065*     (2023.01)
(Continued)

(52) U.S. Cl.
CPC ...... *H01L 23/3675* (2013.01); *H01L 23/3672* (2013.01); *H01L 25/0652* (2013.01);
(Continued)

(58) Field of Classification Search
CPC ............. H01L 23/3672; H01L 23/3675; H01L 25/0652; H01L 25/0655; H01L 25/18
See application file for complete search history.

(56) References Cited

U.S. PATENT DOCUMENTS 8,802,504 B1     8/2014 Hou et al.
8,803,292 B2     8/2014 Chen et al.
(Continued)

FOREIGN PATENT DOCUMENTS

TW     202013631     4/2020
TW     202100703     1/2021

OTHER PUBLICATIONS

"Office Action of Taiwan Counterpart Application", dated Jan. 25, 2022, p. 1-p. 4.

*Primary Examiner* — Karen Kusumakar
*Assistant Examiner* — Adam S Bowen
(74) *Attorney, Agent, or Firm* — JCIPRNET

(57) ABSTRACT

A package structure includes a circuit substrate, a semiconductor package, a thermal interface material, a lid structure and a heat dissipation structure. The semiconductor package is disposed on and electrically connected to the circuit substrate. The thermal interface material is disposed on the semiconductor package. The lid structure is disposed on the circuit substrate and surrounding the semiconductor package, wherein the lid structure comprises a supporting part that is partially covering and in physical contact with the thermal interface material. The heat dissipation structure is disposed on the lid structure and in physical contact with the supporting part of the lid structure.

20 Claims, 36 Drawing Sheets

(51) Int. Cl.
*H01L 25/18* (2023.01)
*H01L 23/00* (2006.01)

(52) U.S. Cl.
CPC .......... *H01L 25/0655* (2013.01); *H01L 25/18* (2013.01); *H01L 24/16* (2013.01); *H01L 24/73* (2013.01); *H01L 2224/16145* (2013.01); *H01L 2224/16227* (2013.01); *H01L 2224/73204* (2013.01)

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 10,763,218 B2 | 9/2020 | Chigullapalli et al. |
| 2008/0111234 A1* | 5/2008 | Hua .................... H01L 23/4275 428/221 |
| 2012/0182694 A1* | 7/2012 | Lin ......................... H01L 23/16 361/728 |
| 2015/0035134 A1* | 2/2015 | Hung ....................... H01L 25/50 257/712 |
| 2015/0162307 A1* | 6/2015 | Chen ..................... H01L 23/367 438/107 |
| 2019/0074252 A1 | 3/2019 | Chigullapalli et al. |

\* cited by examiner

PACKAGE STRUCTURE AND METHOD OF FABRICATING THE SAME

CROSS-REFERENCE TO RELATED APPLICATION

This application claims the priority benefit of U.S. provisional application Ser. No. 63/163,040, filed on Mar. 18, 2021. The entirety of the above-mentioned patent application is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 1A to FIG. 1I are schematic top and sectional views of various stages in a method of fabricating a semiconductor package according to some exemplary embodiments of the present disclosure.

DETAILED DESCRIPTION

Figure 1A:
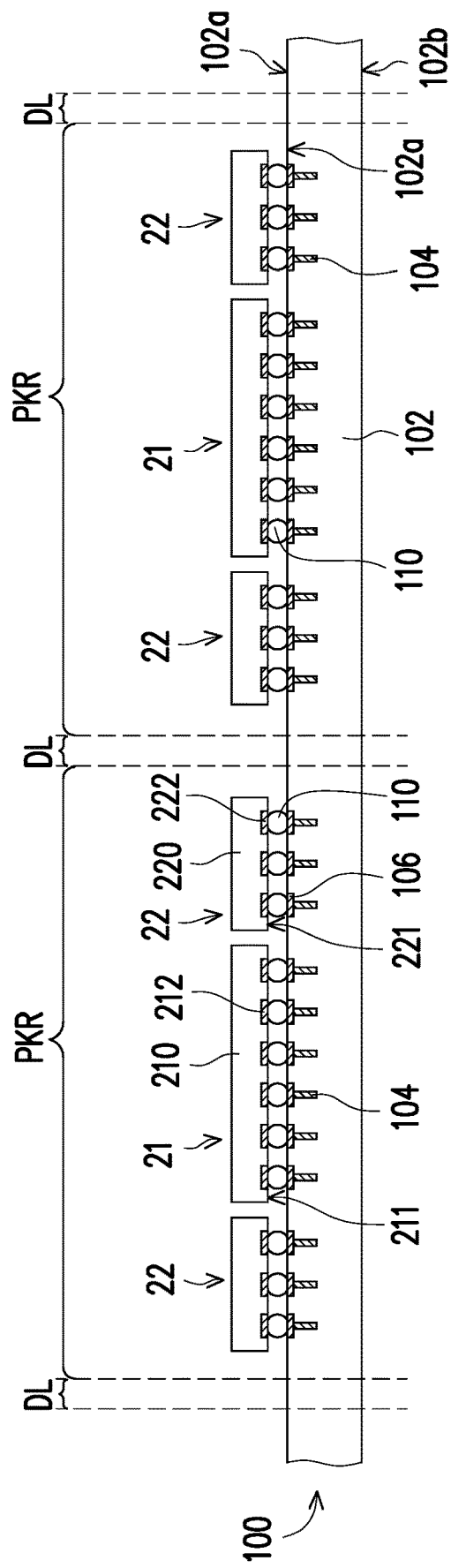

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In current applications, some packages are designed with a heat dissipation structure (e.g. a heat sink) that is directly attached to the semiconductor package. However, the presence of the heat dissipation structure may induce a huge force or stress applied to the semiconductor package, causing damage to the package structure and resulting in reliability issues. In some embodiments of the present disclosure, the design of a lid structure in the package is modified and used for supporting the heat dissipation structure. The stress implemented on the semiconductor package may be reduced, while the warpage of the package structure may also be appropriately controlled.

FIG. 1A to FIG. 1I are schematic top and sectional views of various stages in a method of fabricating a semiconductor package according to some exemplary embodiments of the present disclosure. Referring to FIG. 1A, an interposer structure 100 is provided. In some embodiments, the interposer structure 100 includes a core portion 102, and a plurality of through vias 104 and conductive pads 106 formed therein. In some embodiments, the core portion 102 is a substrate such as a bulk semiconductor substrate, silicon on insulator (SOI) substrate or a multi-layered semiconductor material substrate. The semiconductor material of the substrate (core portion 102) may be silicon, germanium, silicon germanium, silicon carbide, gallium arsenic, gallium phosphide, indium phosphide, indium arsenide, indium antimonide, GaAsP, AlInAs, AlGaAs, GaInAs, GaInP, GaInAsP, or combinations thereof. In some embodiments, the core portion 102 is doped or undoped.

In some embodiments, the conductive pads 106 are formed on a first surface 102a of the core portion 102. In some embodiments, through vias 104 are formed in the core portion 102 and connected with the conductive pads 106. In some embodiments, the through vias 104 extend into the core portion 102 with a specific depth. In some embodiments, the through vias 104 are through-substrate vias. In some embodiments, the through vias 104 are through-silicon vias when the core portion 102 is a silicon substrate. In some embodiments, the through vias 104 are formed by forming holes or recesses in the core portion 102 and then filling the recesses with a conductive material. In some embodiments, the recesses are formed by, for example, etching, milling, laser drilling or the like. In some embodiments, the conductive material is formed by an electro-chemical plating process, chemical vapor deposition (CVD), atomic layer deposition (ALD) or physical vapor deposition (PVD), and the conductive material may include copper, tungsten, aluminum, silver, gold or a combination thereof. In some embodiments, the conductive pads 106 connected with the through vias 104 are formed as conductive parts of the redistribution layer(s) formed on the interposer structure 100. In some embodiments, the conductive pads 106 include under bump metallurgies (UBMs). In certain embodiments, the interposer structure 100 may further include active or passive devices, such as transistors, capacitors, resistors, or diodes passive devices formed in the core portion 102.

As shown in FIG. 1A, the core portion 102 has a plurality of package regions PKR and a dicing lane DL separating each of the plurality of package regions PKR. The through vias 104 and conductive pads 106 are formed in the core portion 102 within the package regions PKR. In some embodiments, a plurality of semiconductor dies 21 (first semiconductor dies) and a plurality of semiconductor dies 22 (second semiconductor dies) are provided on the interposer structure 100, or on the core portion 102 within the package regions PKR. The semiconductor dies 21 and semiconductor dies 22 are individual dies singulated from a wafer. In some embodiments, the semiconductor dies 21 contain the same circuitry, such as devices and metallization patterns, or the semiconductor dies 21 are the same type of dies. In some embodiments, the semiconductor dies 22 contain the same circuitry, or the semiconductor dies 22 are the same type of dies. In certain embodiments, the semiconductor dies 21 and the semiconductor dies 22 have different circuitry or are different types of dies. In some embodiments, the semiconductor dies 21 and the semiconductor dies 22 may have the same circuitry.

Figure 1B:
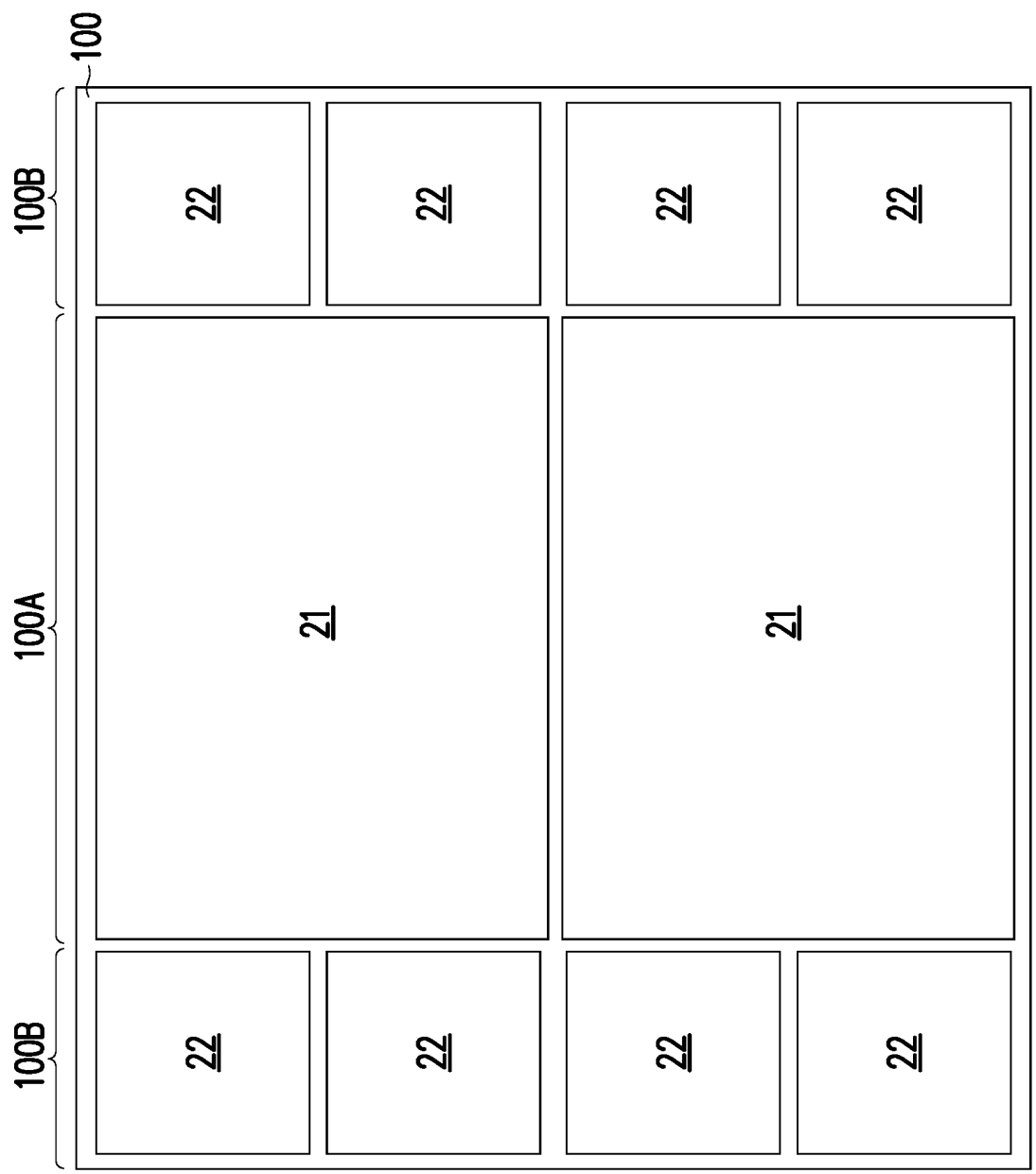

In some embodiments, the semiconductor dies 21 are major dies, while the semiconductor dies 22 are tributary dies. As illustrated in FIG. 1B, the major dies (semiconductor dies 21) are arranged on the core portion 102 in a central region 100A of the interposer structure 100 in each package region PKR. The tributary dies (semiconductor dies 22) are disposed over a peripheral region 100B of the interposer structure 100, and arranged side-by-side and spaced apart from the major dies. In some embodiments, the tributary dies are arranged aside the major dies, and around or surrounding the major dies. In one embodiment, four, six or eight tributary dies are arranged around each of the major dies per one package region PKR. For example, as shown in FIG. 1B, in one exemplary embodiment, four semiconductor dies 22 (tributary dies) are surrounding each of the semiconductor dies 21 (major dies) in each of the package region PKR.

Referring back to FIG. 1A, in some embodiments, the semiconductor dies 21 has a surface area larger than that of the semiconductor dies 22. Also, in some embodiments, the semiconductor dies 21 and the semiconductor dies 22 are of different sizes, including different surface areas and/or different thicknesses. In some embodiments, the semiconductor dies 21 are a logic die, including a central processing unit (CPU) die, graphics processing unit (GPU) die, system-on-a-chip (SoC) die, a microcontroller or the like. In some embodiments, the semiconductor dies 21 is a power management die, such as a power management integrated circuit (PMIC) die. In some embodiments, the semiconductor dies 22 are a memory die, including dynamic random access memory (DRAM) die, static random access memory (SRAM) die or a high bandwidth memory (HBM) die. In some embodiments, the semiconductor dies 22 are dummy dies, which do not perform any electrical functions. The disclosure is not limited thereto, and the number, sizes and types of the semiconductor die disposed on the core portion 102 may be appropriately adjusted based on product requirement.

As illustrated in FIG. 1A, the semiconductor dies 21 include a body 210 and connecting pads 212 formed on an active surface 211 of the body 210. In certain embodiments, the connecting pads 212 may further include pillar structures for bonding the semiconductor dies 21 to other structures. In some embodiments, the semiconductor dies 22 include a body 220 and connecting pads 222 formed on an active surface 221 of the body 220. In other embodiments, the connecting pads 222 may further include pillar structures for bonding the dies 22 to other structures.

In some embodiments, the semiconductor dies 21 and the semiconductor dies 22 are attached to the first surface 102a of the core portion 102, for example, through flip-chip bonding by way of the electrical connectors 110. Through a reflow process, the electrical connectors 110 are formed between the connecting pads 212, 222 and conductive pads 106, and are physically connecting the semiconductor dies 21, 22 to the core portion 102 of the interposer structure 100. In some embodiments, the electrical connectors 110 are located in between the semiconductor dies 21, 22 and the interposer structure 100. In certain embodiments, semiconductor dies 21, 22 are electrically connected to the through vias 104 and the conductive pads 106 through the electrical connectors 110. In some embodiments, when the semiconductor dies 22 are dummy dies, the semiconductor dies 22 may be attached to the electrical connectors 110 through physical connection without establishing an electrical connection thereto. In other words, the connecting pads 222 of the semiconductor dies 22 may be dummy pads, for example.

In one embodiment, the electrical connectors 110 are micro-bumps, such as micro-bumps having copper metal pillars. In another embodiment, the electrical connectors 110 are solder bumps, lead-free solder bumps, or micro bumps, such as controlled collapse chip connection (C4) bumps or micro bumps containing copper pillars. In some embodiments, the bonding between the semiconductor dies 21, 22 and the core portion 102 is solder bonding. In some embodiments, the bonding between the semiconductor dies 21, 22 and the core portion 102 is direct metal-to-metal bonding, such as copper-to-copper bonding.

Figure 1C:
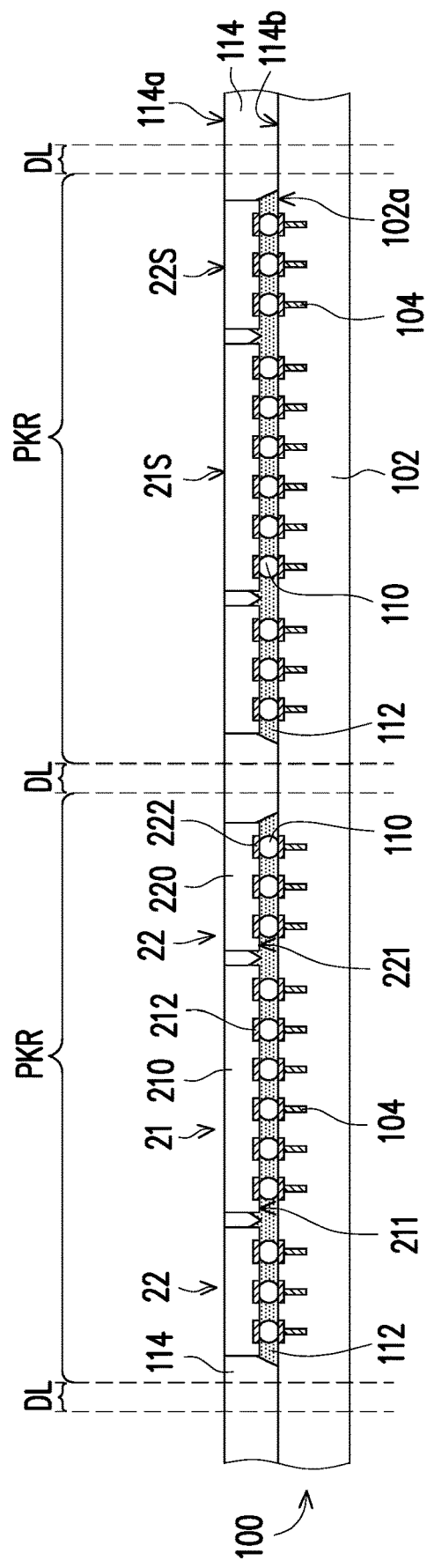

Referring to FIG. 1C, in some embodiments, an underfill structure 112 may be formed to cover the plurality of electrical connectors 110, and to fill up the spaces in between the semiconductor dies 21, 22 and the interposer structure 100. In some embodiments, the underfill structure 112 further cover side walls of the semiconductor dies 21, 22, and is located within the package region PKR. Thereafter, an insulating encapsulant 114 (or molding compound) may be formed over the interposer structure 100 (or over the core portion 102) to cover the underfill structure 112, and to surround the semiconductor dies 21 and 22.

In some embodiments, the insulating encapsulant 114 is formed on the first surface 102a of the core portion 102 in the package regions PKR and over the dicing lanes DL. In some embodiments, the insulating encapsulant 114 is formed through, for example, a compression molding process or transfer molding. In one embodiment, a curing process is performed to cure the insulating encapsulant 114. In some embodiments, the semiconductor dies 21, 22 and the electrical connectors 110 are encapsulated by the insulating encapsulant 114. In some embodiments, a planarization process, including grinding or polishing, is performed to partially remove the insulating encapsulant 114, exposing backside surfaces 21S, 22S of the semiconductor dies 21, 22. Accordingly, the backside surfaces 21S, 22S of the semiconductor dies 21, 22 are levelled with a top surface 114a of the insulating encapsulant 114. The top surface 114a being opposite to a backside surface 114b of the insulating encapsulant 114, wherein the backside surface 114b is in contact with the core portion 102. In some embodiments, the backside surfaces 21S, 22S of the semiconductor dies 21, 22 are not exposed from the insulating encapsulant 114, and are well protected by the insulating encapsulant 114.

In some embodiments, a material of the insulating encapsulant 114 includes polymers (such as epoxy resins, phenolic resins, silicon-containing resins, or other suitable resins), dielectric materials having low permittivity (Dk) and low loss tangent (Df) properties, or other suitable materials. In another embodiment, the insulating encapsulant 114 may include an acceptable insulating encapsulation material. In some embodiments, the insulating encapsulant 114 may further include inorganic filler or inorganic compound (e.g. silica, clay, and so on) which can be added therein to optimize coefficient of thermal expansion (CTE) of the insulating encapsulant 114. The disclosure is not limited thereto.

Figure 1D:
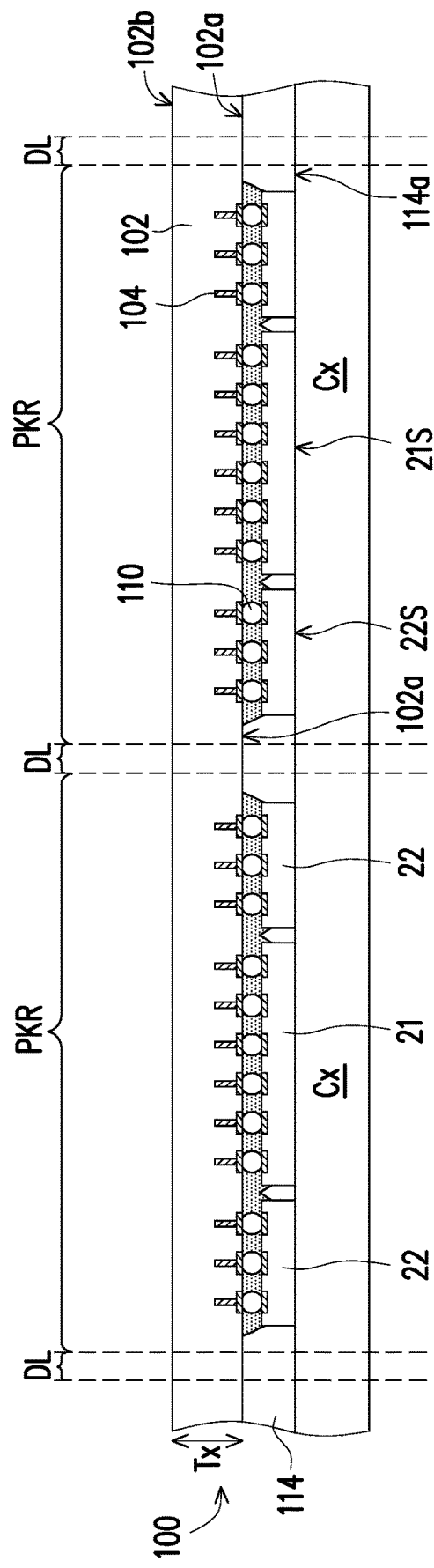

Referring to FIG. 1D, the structure of FIG. 1C is turned upside down or flipped, and placed on a carrier Cx, so that the carrier Cx directly contacts the backside surfaces 21S, 22S of the semiconductor dies 21, 22 and the top surface 114a of the insulating encapsulant 114. As shown in FIG. 1D, at this stage of processing, the interposer structure 100 has not been thinned and has a thickness Tx. In other words, the through vias 104 are not revealed, and are embedded in the core portion 102 of the interposer structure 100.

Figure 1E:
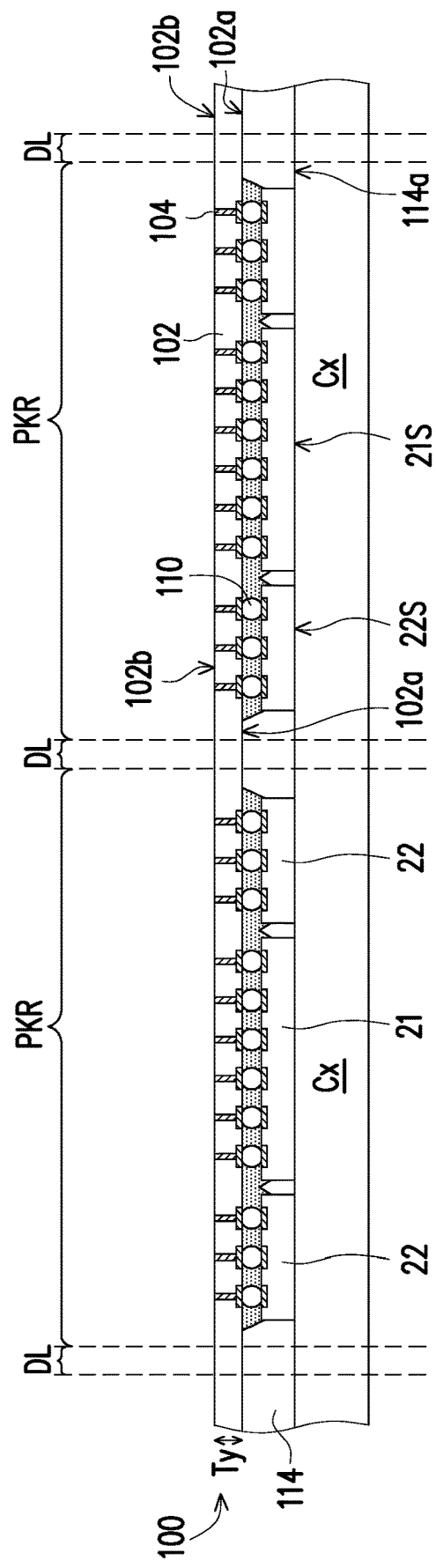

Referring to FIG. 1E, a thinning process is performed to the interposer 100 to partially remove or thin the core portion 102 of the interposer structure 100 until the through vias 104 are exposed and a second surface 102b of the core portion 102 is formed. In some embodiments, the thinning process may include a back-grinding process, a polishing process or an etching process. In some embodiments, after the thinning process, the interposer structure 100 is thinned to a thickness Ty. In some embodiments, a ratio of the thickness Ty to the thickness Tx ranges from about 0.1 to about 0.5.

Figure 1F:
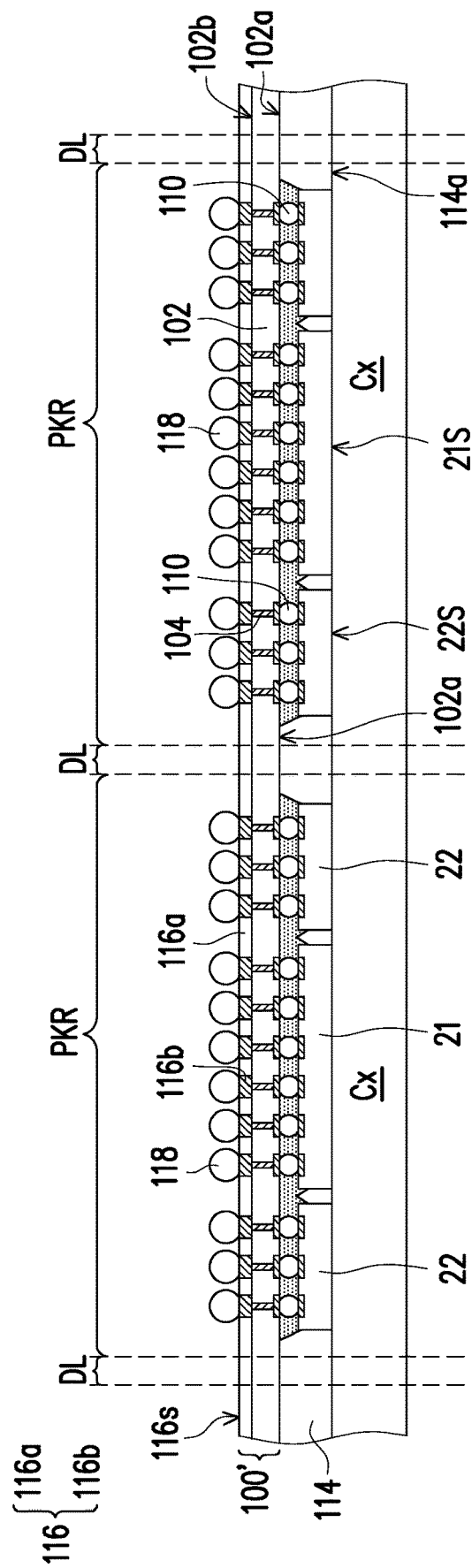

Referring to FIG. 1F, a redistribution structure 116 is formed on the second surface 102b of the core portion 102 in the package region PKR and over the dicing lanes DL. The second surface 102b being opposite to the first surface 102a of the core portion 102. In some embodiments, the redistribution structure 116, the core portion 102, the through vias 104 and conductive pads 106 constitutes the interposer structure 100'. In some embodiments, the redistribution structure 116 electrically connects the through vias 104 and/or electrically connects the through vias 104 with external devices. In certain embodiments, the redistribution structure 116 includes at least one dielectric layer 116a and metallization patterns 116b in the dielectric layer 116a. In some embodiments, the metallization patterns 116b may comprise pads, vias and/or trace lines to interconnect the through vias 104 and to further connect the through vias 104 to one or more external devices. Although one layer of dielectric layer 116a, and one layer of the metallization patterns 116b is shown in FIG. 1F, it should be noted that the number of layers of the dielectric layer 116a and the metallization patterns 116b is not limited thereto, and this could be adjusted based on requirement.

In some embodiments, the material of the dielectric layer 116a comprises silicon oxide, silicon nitride, silicon carbide, silicon oxynitride, or low-K dielectric materials (such as phosphosilicate glass materials, fluorosilicate glass materials, boro-phosphosilicate glass materials, SiOC, spin-on-glass materials, spin-on-polymers or silicon carbon materials). In some embodiments, the dielectric layer 116a is formed by spin-coating or deposition, including chemical vapor deposition (CVD), PECVD, HDP-CVD, or the like. In some embodiments, the metallization patterns 116b include under-metal metallurgies (UBMs). In some embodiments, the formation of the metallization patterns 116b may include patterning the dielectric layer using photolithography techniques and one or more etching processes and filling a metallic material into the openings of the patterned dielectric layer. Any excessive conductive material on the dielectric layer may be removed, such as by using a chemical mechanical polishing process. In some embodiments, the material of the metallization patterns 116b includes copper, aluminum, tungsten, silver, and combinations thereof.

As further illustrated in FIG. 1F, a plurality of conductive terminals 118 is disposed on the metallization patterns 116b, and are electrically coupled to the through vias 104. In some embodiments, the conductive terminals 118 are placed on the top surface 116s of the redistribution structure 116, and electrically connected to the through vias 104 by the metallization patterns 116b within the package region PKR. In certain embodiments, the conductive terminals 118 are positioned on and physically attached to the metallization patterns 116b. In some embodiments, the conductive terminals 118 include lead-free solder balls, solder balls, ball grid array (BGA) balls, bumps, C4 bumps or micro bumps. In some embodiments, the conductive terminals 118 may include a conductive material such as solder, copper, aluminum, gold, nickel, silver, palladium, tin, or a combination thereof. In some embodiments, the conductive terminals 118 are formed by forming the solder paste on the redistribution structure 116 by, for example, evaporation, electroplating, printing or solder transfer and then reflowed into the desired bump shapes. In some embodiments, the conductive terminals 118 are placed on the redistribution structure 116 by ball placement or the like. In other embodiments, the conductive terminals 118 are formed by forming solder-free metal pillars (such as a copper pillar) by sputtering, printing, electroless or electro plating or CVD, and then forming a lead-free cap layer by plating on the metal pillars. The conductive terminals 118 may be used to bond to an external device or an additional electrical component. In some embodiments, the conductive terminals 118 are used to bond to a circuit substrate, a semiconductor substrate or a packaging substrate.

Figure 1G:
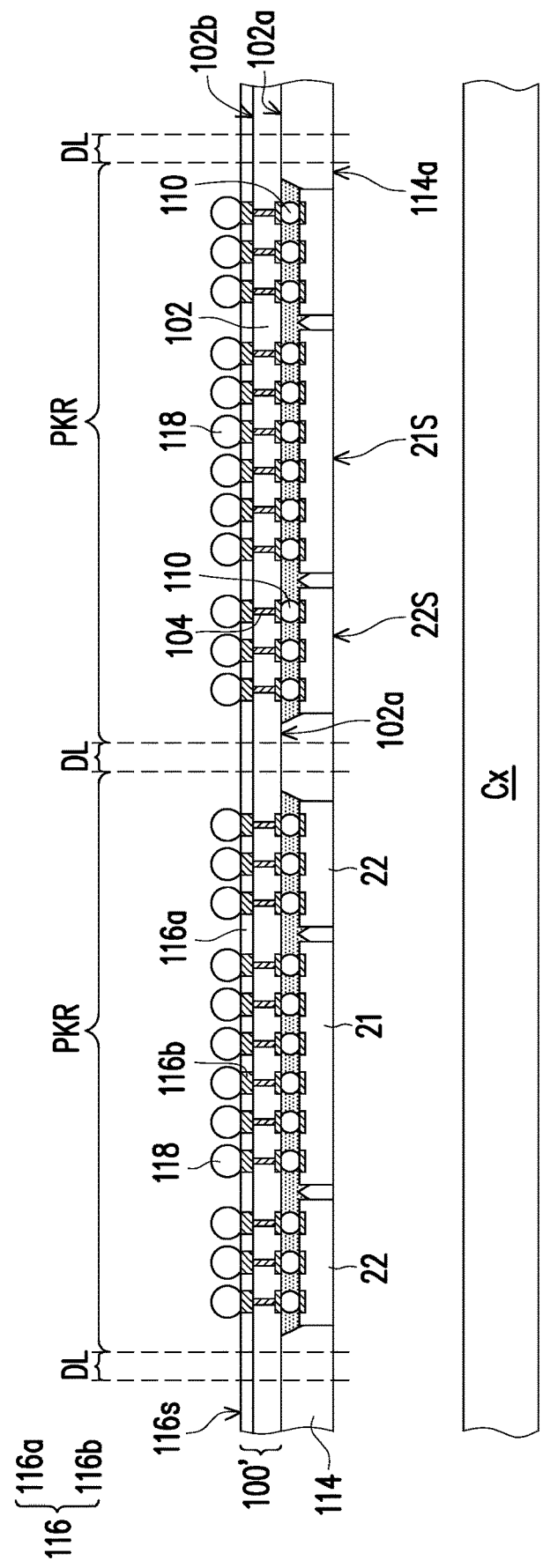

Referring to FIG. 1G, in a subsequent step, the carrier Cx is de-bonded. For example, the de-bonding process includes projecting a light such as a laser light or an UV light on a debond layer (e.g., light-to-heat-conversion release layer) that is attached to the carrier Cx (not shown), so that the carrier Cx can be easily removed along with the debond layer. In some embodiments, the backside surfaces 21S, 22S of the semiconductor dies 21, 22 are revealed after the de-bonding process.

Figure 1H:
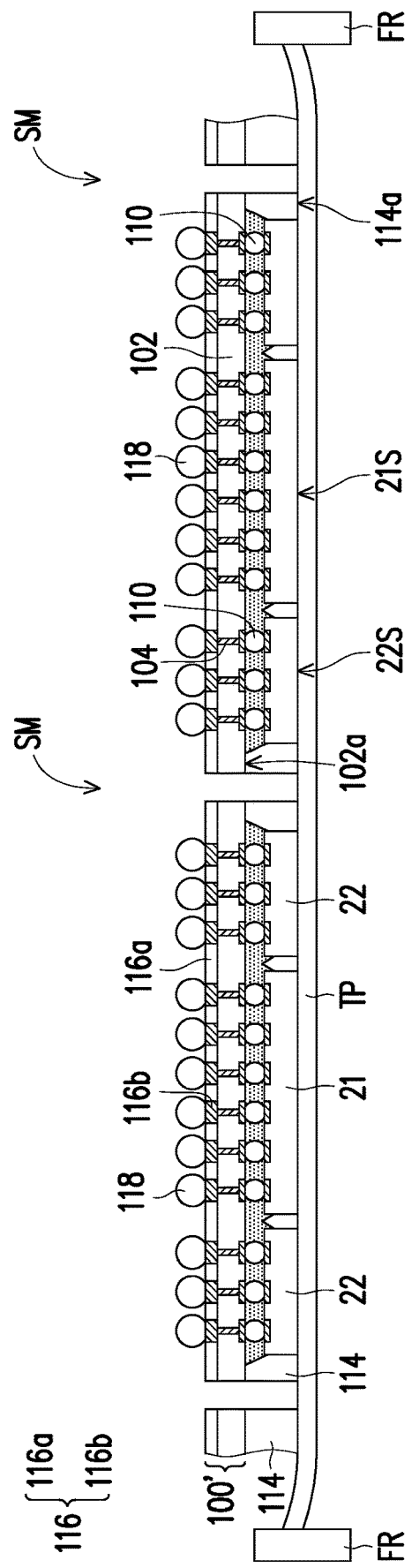

Referring to FIG. 1H, after de-bonding the carrier Cx, the structure shown in FIG. 1G is attached to a tape TP (e.g., a dicing tape) supported by a frame FR. Subsequently, the structure shown in FIG. 1G is diced or singulated along the dicing lanes DL to form a plurality of semiconductor packages SM. For example, the dicing process is performed to cut through the redistribution structure 116, the core portion 102, and the insulating encapsulant 114 to remove portions of the redistribution structure 116, the core portion 102, and the insulating encapsulant 114 along the dicing lanes DL. In some embodiments, the dicing process or the singulation process typically involves dicing with a rotating blade or a laser beam. In other words, the dicing or singulation process is, for example, a laser cutting process, a mechanical sawing process, or other suitable processes. After debonding the carrier Cx, the singulated semiconductor package SM illustrated in FIG. 1I can be obtained.

Figure 2:
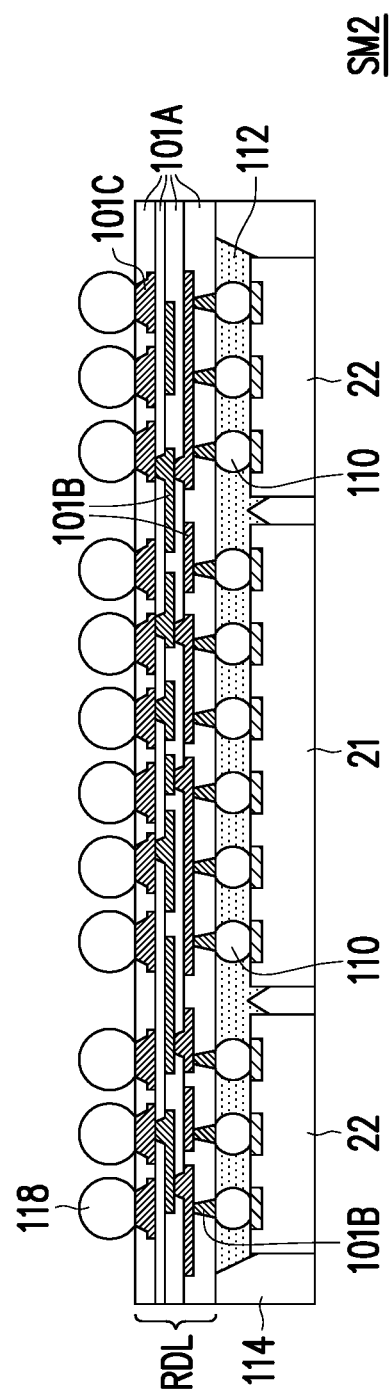
FIG. 2 is a schematic sectional view of a semiconductor package according to some other exemplary embodiments of the present disclosure.

FIG. 2 is a schematic sectional view of a semiconductor package according to some other exemplary embodiments of the present disclosure. The semiconductor package SM2 illustrated in FIG. 2 is similar to the semiconductor package SM illustrated in FIG. 1I. Therefore, the same reference numerals may be used to refer to the same or liked parts, and its detailed description will be omitted herein. The difference between the embodiments is that the interposer structure 100' illustrated in FIG. 1I is replaced with a redistribution layer RDL illustrated in FIG. 2. As illustrated in FIG. 2, the redistribution layer RDL is disposed on the insulating encapsulant 114 and electrically connected to the semiconductor dies 21, 22 through the electrical connectors 110.

In some embodiments, the redistribution layer RDL is formed by sequentially forming one or more dielectric layers 101A and one or more conductive layers 101B in alternation. In certain embodiments, the conductive layers 101B are sandwiched between the dielectric layers 101A, and are electrically and physically connected to the electrical connectors 110. In the exemplary embodiment, the numbers of the dielectric layers 101A and the conductive layers 101B included in the redistribution layer RDL is not limited thereto, and may be designated and selected based on the design requirements. For example, the numbers of the dielectric layers 101A and the conductive layers 101B may be one or more than one.

In some embodiments, the material of the dielectric layers 101A is polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers DI1 is formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive layer 101B is made of conductive materials formed by electroplating or deposition, such as aluminum, titanium, copper, nickel, tungsten, and/or alloys thereof, which may be patterned using a photolithography and etching process. In some embodiments, the conductive layer 101B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In certain embodiments, the redistribution layer RDL further includes a plurality of conductive pads 101C disposed on the conductive layers 101B for electrically connecting with conductive terminals 118. In some embodiments, the materials of the conductive pads 101C may include copper, nickel, titanium, tungsten, or alloys thereof or the like, and may be formed by an electroplating process, for example. The number of conductive pads 101C are not limited in this disclosure, and may be selected based on the design layout. In some embodiments, the conductive pads 101C may be omitted. In other words, the conductive terminals 118 formed in subsequent steps may be directly disposed on the conductive layers 101B of the redistribution layer RDL.

Figure 3:
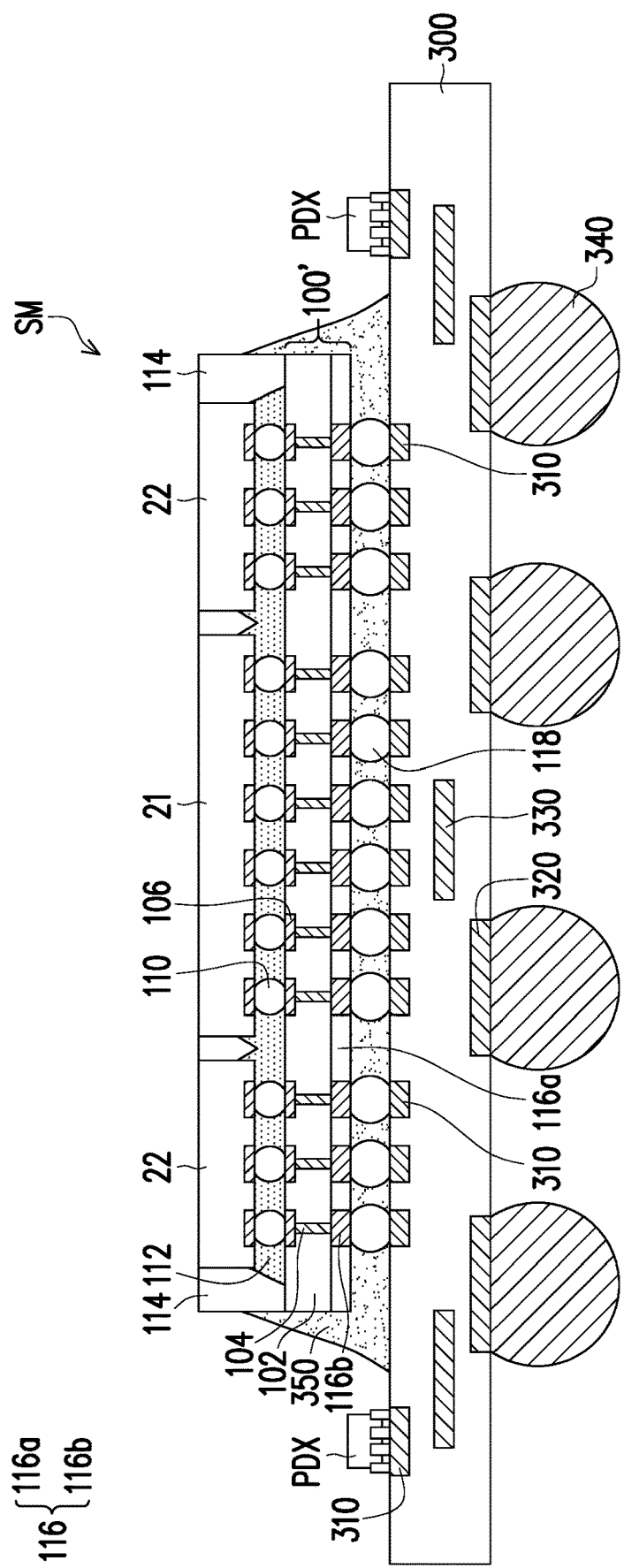
FIG. 3 to FIG. 5B are schematic top, sectional and three-dimensional views of various stages in a method of fabricating a package structure according to some exemplary embodiments of the present disclosure.

FIG. 3 to FIG. 5B are schematic top, sectional and three-dimensional views of various stages in a method of fabricating a package structure according to some exemplary embodiments of the present disclosure. Referring to FIG. 3, in some embodiments, the semiconductor package SM obtained in FIG. 1I is mounted or attached onto a circuit substrate 300 through the conductive terminals 118. In some embodiments, the circuit substrate 300 includes contact pads 310, contact pads 320, metallization layers 330, and vias (not shown). In some embodiments, the contact pads 310 and the contact pads 320 are respectively distributed on two opposite sides of the circuit substrate 300, and are exposed for electrically connecting with later-formed elements/features. In some embodiments, the metallization layers 330 and the vias are embedded in the circuit substrate 300 and together provide routing function for the circuit substrate 300, wherein the metallization layers 330 and the vias are electrically connected to the contact pads 310 and the contact pads 320. In other words, at least some of the contact pads 310 are electrically connected to some of the contact pads 320 through the metallization layers 330 and the vias. In some embodiments, the contact pads 310 and the contact pads 320 may include metal pads or metal alloy pads. In some embodiments, the materials of the metallization layers 330 and the vias may be substantially the same or similar to the material of the contact pads 310 and the contact pads 320.

Furthermore, in some embodiments, the semiconductor package SM is bonded to the circuit substrate 300 through physically connecting the conductive terminals 118 and the contact pads 310 to form a stacked structure. In certain embodiments, the semiconductor package SM is electrically connected to the circuit substrate 300. In some embodiments, the circuit substrate 300 is such as an organic flexible substrate or a printed circuit board. In such embodiments, the conductive terminals 118 are, for example, chip connectors. In some embodiments, a plurality of conductive balls 340 are respectively formed on the substrate 300. As illustrated in FIG. 3, for example, the conductive balls 340 are connected to the contact pads 320 of the circuit substrate 300. In other words, the conductive balls 340 are electrically connected to the circuit substrate 300 through the contact pads 320. Through the contact pads 310 and the contact pads 320, some of the conductive balls 340 are electrically connected to the semiconductor package SM (e.g. the semiconductor dies 21 and 22 included therein). In some embodiments, the conductive balls 340 are, for example, solder balls or BGA balls. In some embodiments, the semiconductor package SM is bonded to the circuit substrate 300 through physically connecting the conductive terminals 118 and the contact pads 310 of the circuit substrate 300 by a chip on wafer on substrate (CoWoS) packaging processes. In addition, as illustrated in FIG. 3, passive devices PDX (integrated passive device or surface mount devices) may be mounted on the circuit substrate 300. For example, the passive devices PDX may be mounted on the contact pads 310 of the circuit substrate 300 through a soldering process. The disclosure is not limited thereto. In certain embodiments, the passive devices PDX may be mounted on the circuit substrate surrounding the semiconductor package SM. In some embodiments, the passive devices PDX are omitted.

As further illustrated in FIG. 3, in some embodiments, an underfill structure 350 is formed to fill up the spaces in between the circuit substrate 300 and the semiconductor package SM. In certain embodiments, the underfill structure 350 fills up the spaces in between adjacent conductive terminals 118 and covers the conductive terminals 118. For example, the underfill structure 350 surrounds the plurality of conductive terminals 118. In some embodiments, the passive devices PDX is exposed by the underfill structure 350, and kept a distance apart from the underfill structure 350. In other words, the underfill structure 350 does not cover the passive devices PDX.

Figure 4A:
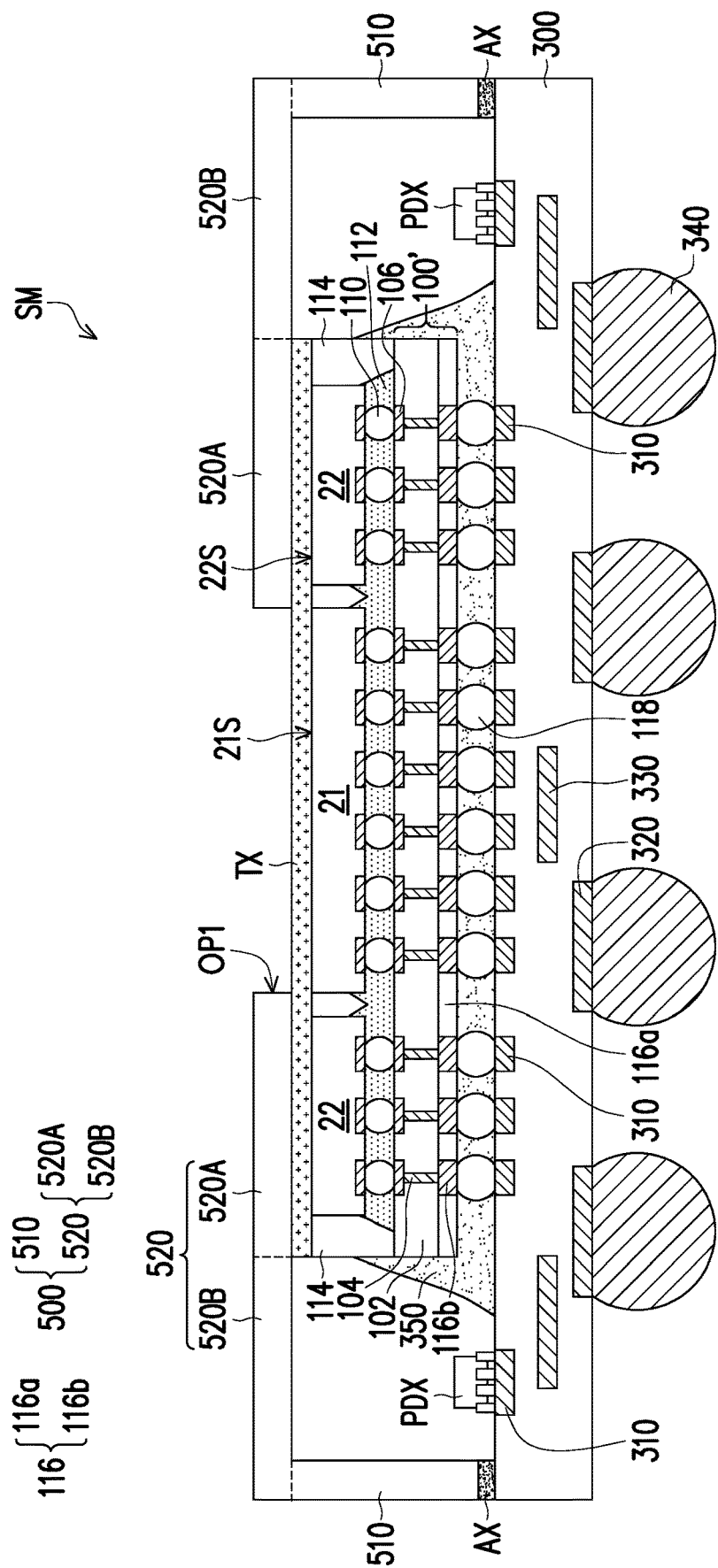

Referring to FIG. 4A, in a subsequent step, a lid structure 500 is disposed on the circuit substrate 300. In some embodiments, before mounting the lid structure 500 on the circuit substrate 300, a thermal interface material TX is mounted on the backside surfaces 21S, 22S of the semiconductor dies 21, 22. In some embodiments, the thermal interface material TX may be a polymer having a good thermal conductivity (Tk), which may be between about 3 watts per meter kelvin (W/mK) to about 5 W/mK. In some embodiments, the thermal interface material TX may include a polymer with thermal conductive fillers. The thermal conductive fillers may increase the effective Tk of the thermal interface material TX to be between about 10 W/mK to about 50 W/mK or more. Applicable thermal conductive filler materials may include aluminum oxide, boron nitride, aluminum nitride, aluminum, copper, silver, indium, a combination thereof, or the like. In other embodiments, the thermal interface material TX may comprise other materials such as a metallic-based or solder-based material comprising silver, indium paste, or the like.

As illustrated in FIG. 4A, the lid structure 500 is attached to the circuit substrate 300 through an adhesive material Ax. In some embodiments, the lid structure 500 includes a sidewall part 510 and a supporting part 520. For example, the sidewall part 510 is disposed on and attached to the circuit substrate 300 through the adhesive material Ax, and is surrounding the semiconductor package SM. Furthermore, the supporting part 520 is disposed on and in physical contact with the sidewall part 510. In some embodiments, the supporting part 520 includes a first portion 520A and a second portion 520B. The first portion 520A is in physical contact with the thermal interface material TX, and overlapped with the semiconductor package SM. The second portion 520B is non-overlapped with the semiconductor package SM, while being overlapped with the passive devices PDX.

Figure 4B:
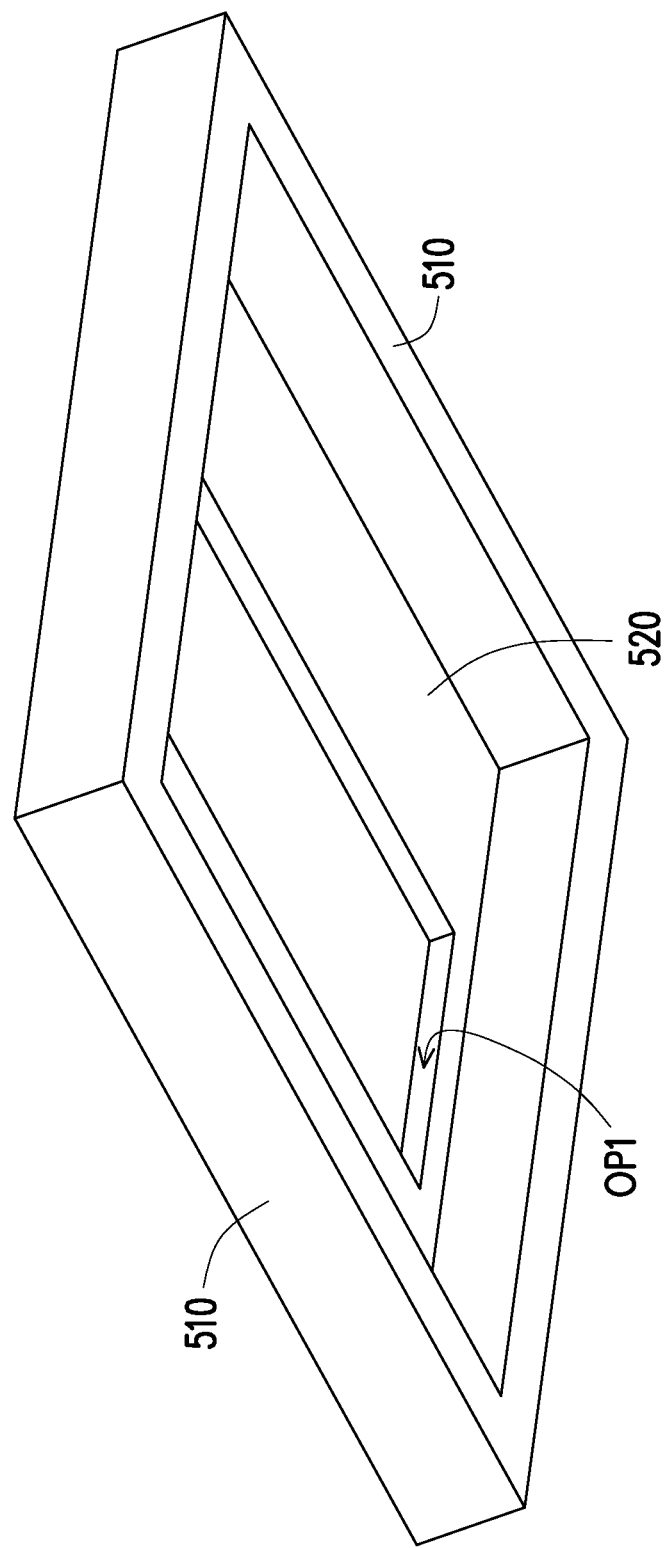
Figure 4C:
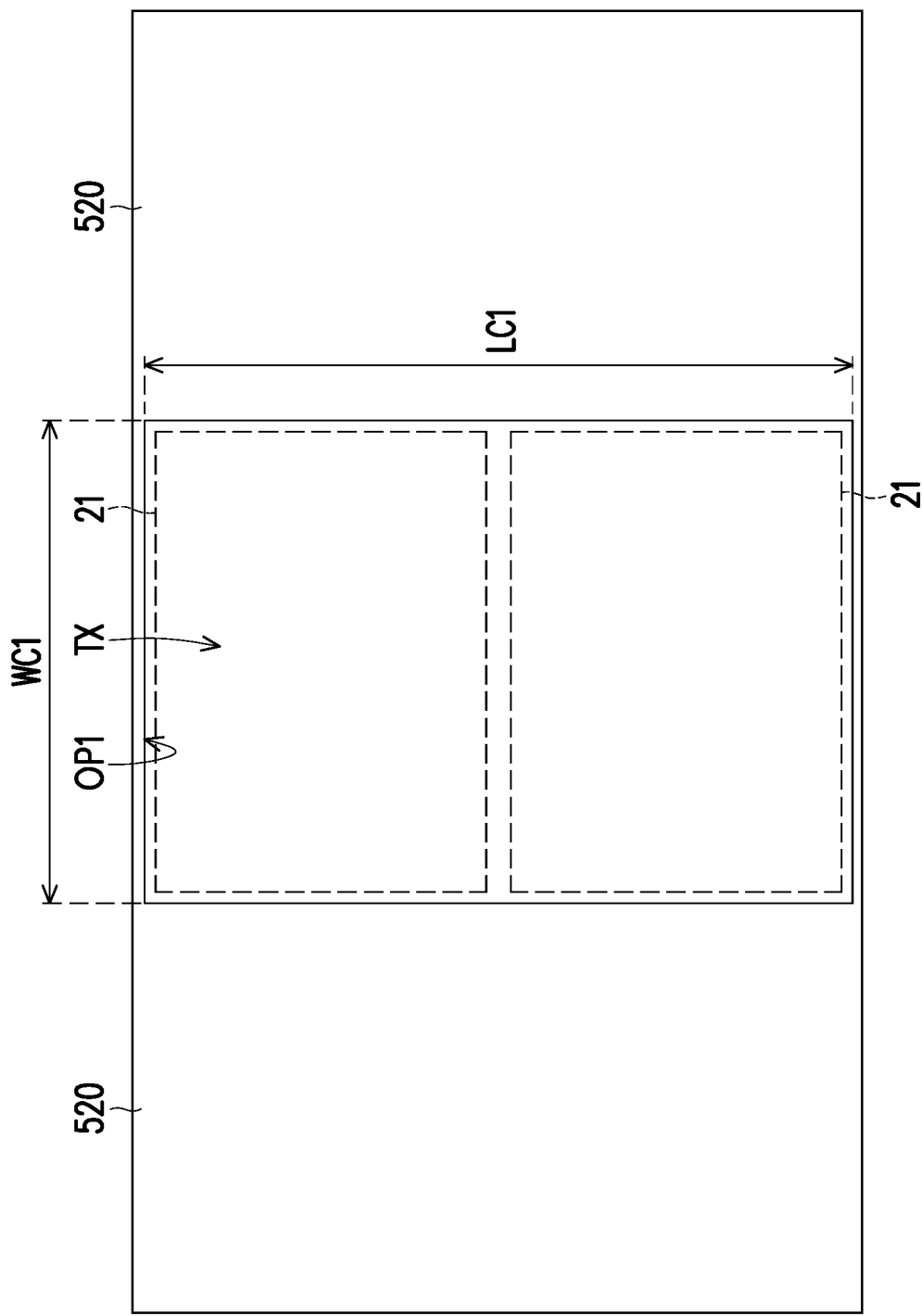

As illustrated in FIG. 4A and from the three-dimensional view of the lid structure 500 shown in FIG. 4B, the lid structure 500 includes a first opening OP1. For example, the supporting part 520 of the lid structure 500 includes the first opening OP1. In some embodiments, the first opening OP1 reveals portions of the thermal interface material TX. In other words, the thermal interface material TX is partially covered up by the lid structure 500, while being partially exposed through the first opening OP1. In certain embodiments, the first opening OP1 is overlapped with the plurality of first semiconductor dies 21, while being non-overlapped with the plurality of second semiconductor dies 22. As further illustrated in FIG. 4C, which is a top view of the lid structure 500 shown in FIG. 4A, the first opening OP1 include a width of WC1 and a length of LC1. In some embodiments, the width WC1 and the length LC1 substantially corresponds to a sum of the widths and a sum of the lengths of the two first semiconductor dies 21 located over the central region 100A (shown in FIG. 1B) of the interposer structure 100'. The dimensions of the width WC1 and the length LC1 may vary depending on the size of the first semiconductor dies 21 used, and is not particularly limited. In other words, an area of the first opening OP1 substantially corresponds to an area occupied by the first semiconductor dies 21. In the exemplary embodiment, the area of the first opening OP1 substantially corresponds to the area occupied by the first semiconductor dies 21 so that a suitable balance between a stress alleviating effect and a heat dissipation effect of the package structure can be obtained.

Figure 5A:
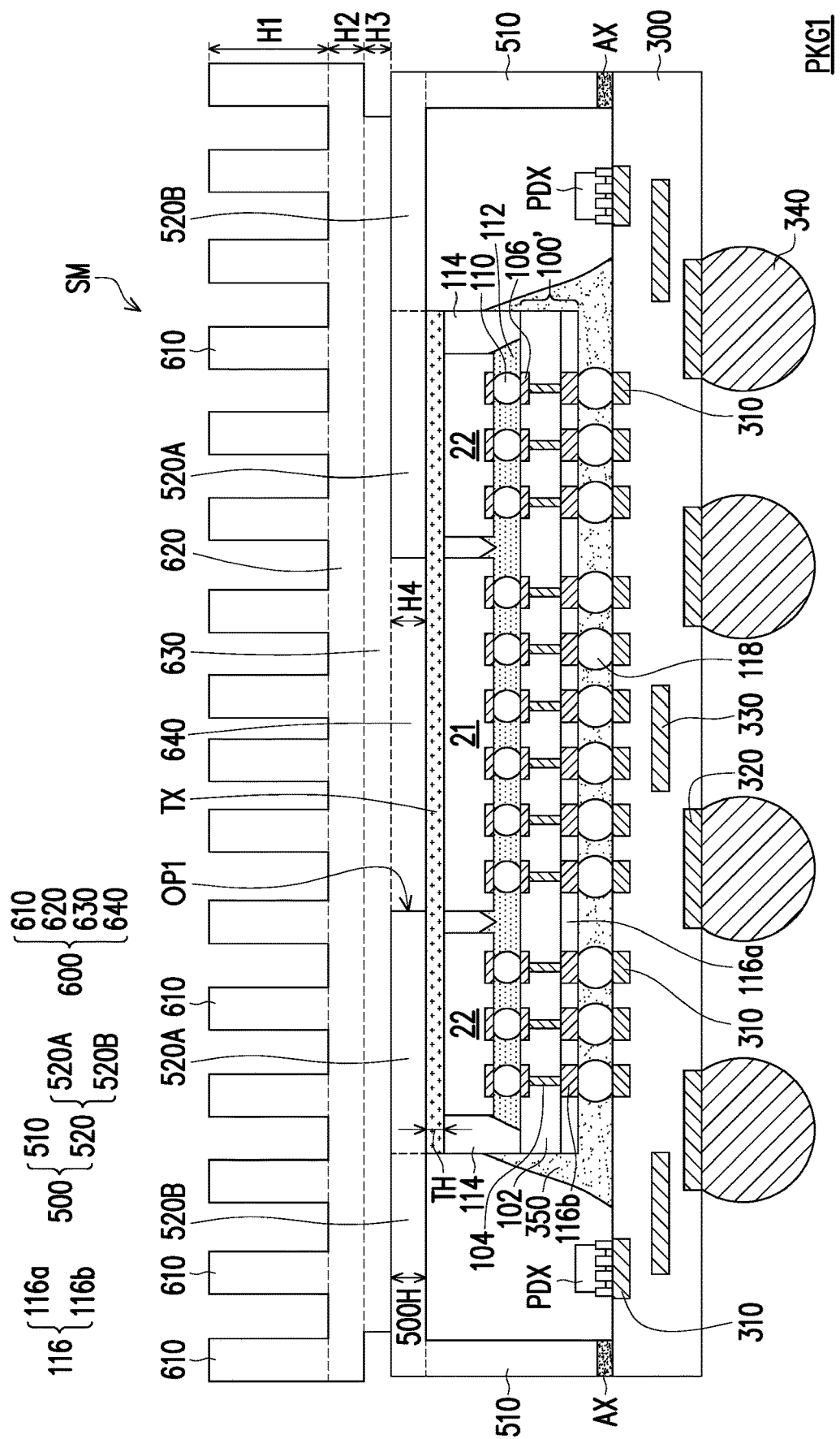

Referring to FIG. 5A, in a subsequent step, a heat dissipation structure 600 is disposed on the lid structure 500. For example, the heat dissipation structure 600 is disposed on the lid structure 500 and in physical contact with the supporting part 520 of the lid structure 500. In some embodiments, the heat dissipation structure 600 is a heat sink comprising a plurality of fin structures 610, a fin base 620, a step structure 630 and a protruding portion 640. The fin base 620 is supporting the plurality of fin structures 610. In some embodiments, the fin structures 610 are evenly distributed over the surface of the fin base 620. Furthermore, the step structure 630 is supporting the fin base 620, and the protruding portion 640 is disposed on the step structure 630. In some embodiments, the protruding portion 640 extends and fills into the first opening OP1 of the lid structure 500, and is in physical contact with the thermal interface material TX. In certain embodiments, the protruding portion 640 is surrounded by the supporting part 520 of the lid structure 500.

Figure 5B:
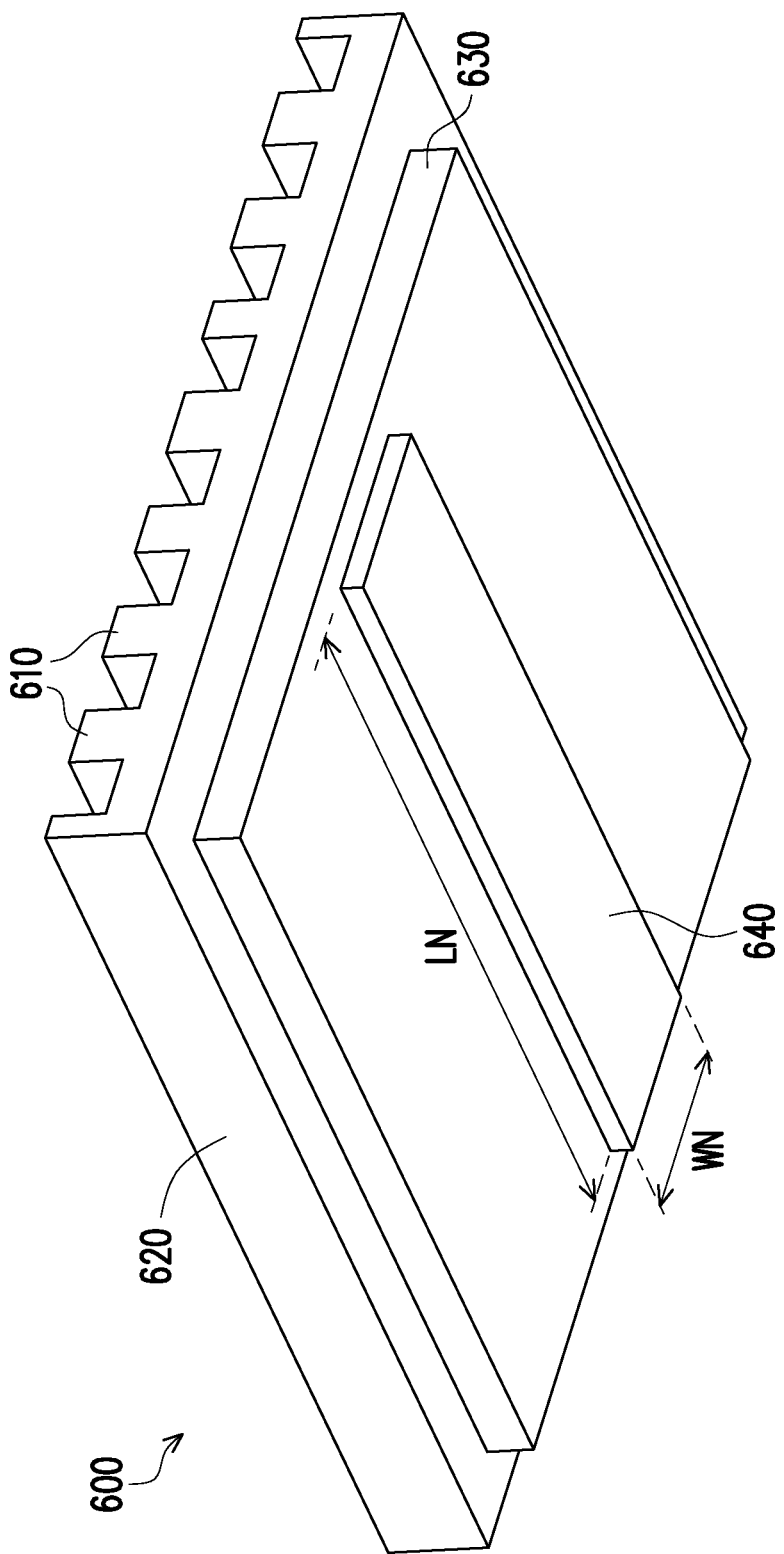

As illustrated in FIG. 5A, and as shown in the three-dimensional view of the heat dissipation structure 600 shown in FIG. 5B, a width of the step structure 630 is smaller than a width of the fin base 620, and a width of the protruding portion 640 is smaller than the width of the step structure 630. In some embodiments, an occupied volume of the step structure 630 is smaller than an occupied volume of the fin base 620, and an occupied volume of the protruding portion 640 is smaller than the occupied volume of the step structure 630. In some embodiments, the protruding portion 640 has a width of WN and a length of LN. For example, the width WN and the length LN of the protruding portion 640 substantially corresponds to the width WC1 and the length LC1 of the first opening OP1. In other words, an area of a top surface of the protruding portion 640 substantially corresponds to an area occupied by the first semiconductor dies 21 over the central region 100A (shown in FIG. 1B) of the interposer structure 100'. In another embodiment, the dimensions (length and width) of the protruding portion 640 is slightly smaller than the dimensions (length and width) of the first opening OP1 so that the protruding portion 640 may be easily disposed within the first opening OP1. For example, a ratio of the dimensions (length and width) of the protruding portion 640 to the dimensions (length and width) of the first opening OP1 may be in a range of 0.9:1 to 0.99:1. In some other embodiments, an adhesive (or thermal tape) may be optionally used for attaching the heat dissipation structure 600 onto the lid structure 500.

In some embodiments, the fin structures 610 have a height of H1, the fin base 620 has a height of H2, the step structure 630 has a height of H3, and the protruding portion 640 has a height of H4. In some embodiments, the heights, H2, H3, H4 are smaller than the height H1. In certain embodiments, the height H2 is substantially equal to the heights H3 and H4, but the disclosure is not limited thereto. In some embodiments, the heights, H2, H3, H4 may be appropriately adjusted as long as they are smaller than the height H1. In some embodiments, the height H4 of the protruding portion 640 is substantially equal to a thickness 500H of the supporting part 520 of the lid structure 500. In other words, the height H4 of the protruding portion 640 may vary depending on the design of the supporting part 520. Furthermore, in some embodiments, a thickness TH of the thermal interface material TX is smaller than the heights H1~H4, and smaller than the thickness 500H of the supporting part 520.

After disposing the heat dissipation structure 600 over the lid structure 500, a package structure PKG1 according to some embodiments of the present disclosure is accomplished. In the package structure PKG1 shown in FIG. 5A, the supporting part 520 of the lid structure 500 provides an enhanced support to reduce the stress implemented on the semiconductor package SM and the circuit substrate 300. As such, the stress or force induced on the package may be alleviated, while the warpage of the package structure PKG1 may also be appropriately controlled.

FIG. 6 to FIG. 8B are schematic top, sectional and three-dimensional views of various stages in a method of fabricating a package structure according to some exemplary embodiments of the present disclosure. The method of fabricating the package structure illustrated in FIG. 6 to FIG. 8B is similar to the method of fabricating the package structure illustrated in FIG. 1A to FIG. 1I and FIG. 3 to FIG. 5B. Therefore, the same reference numerals are used to refer to the same or liked parts, and its detailed description will be omitted herein.

Figure 6:
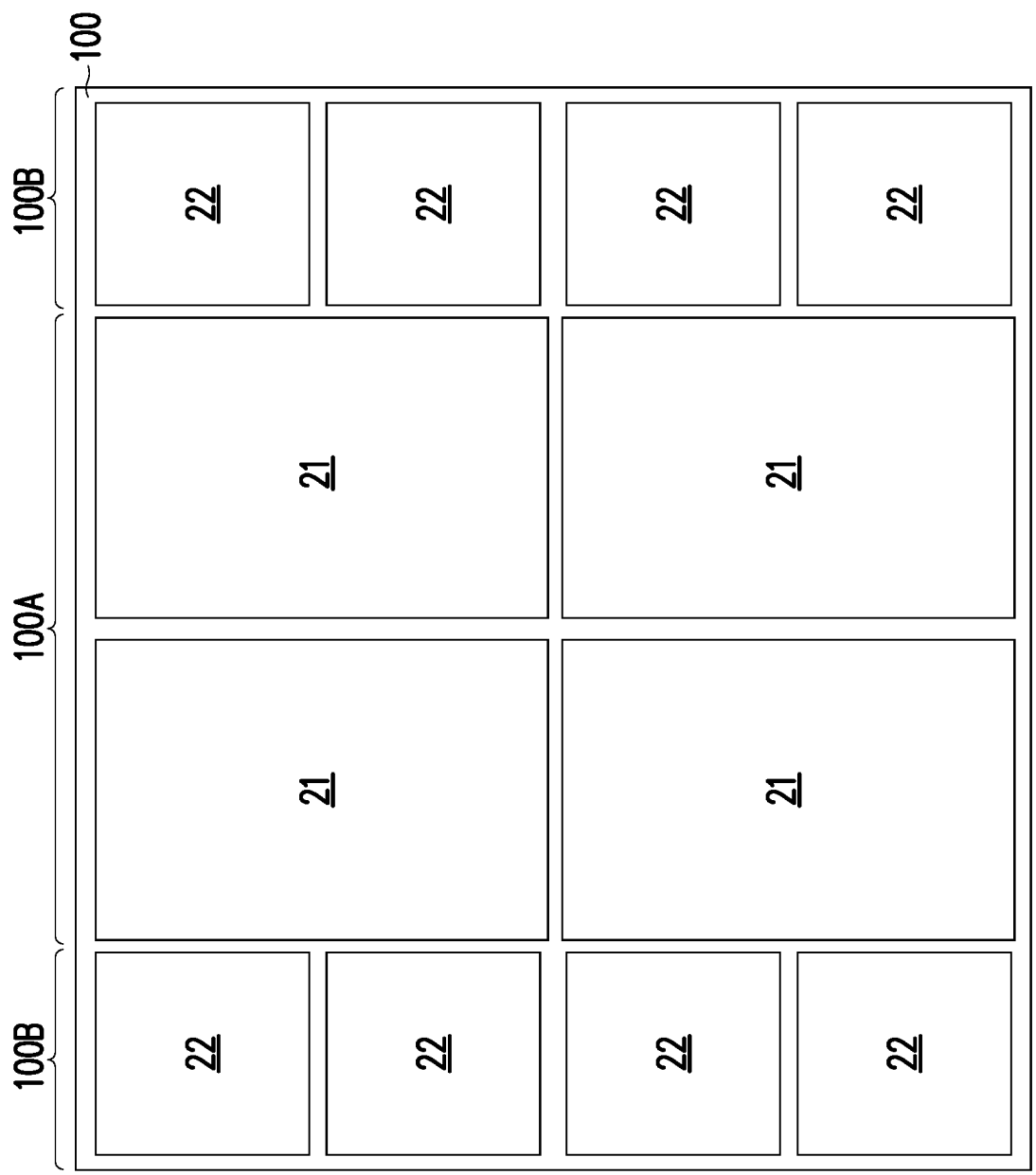
FIG. 6 to FIG. 8B are schematic top, sectional and three-dimensional views of various stages in a method of fabricating a package structure according to some exemplary embodiments of the present disclosure.

FIG. 6 is a stage of manufacturing a package structure similar to the stage illustrated in FIG. 1B. The difference between the embodiments is that there are more semiconductor dies 21 (first semiconductor dies) provided on the interposer structure 100. For example, as illustrated in FIG. 6, four semiconductor dies 21 are arranged on the core portion 102 in a central region 100A of the interposer structure 100, while eight semiconductor dies 22 are arranged aside the four semiconductor dies 21 in the peripheral region 100.

Figure 7A:
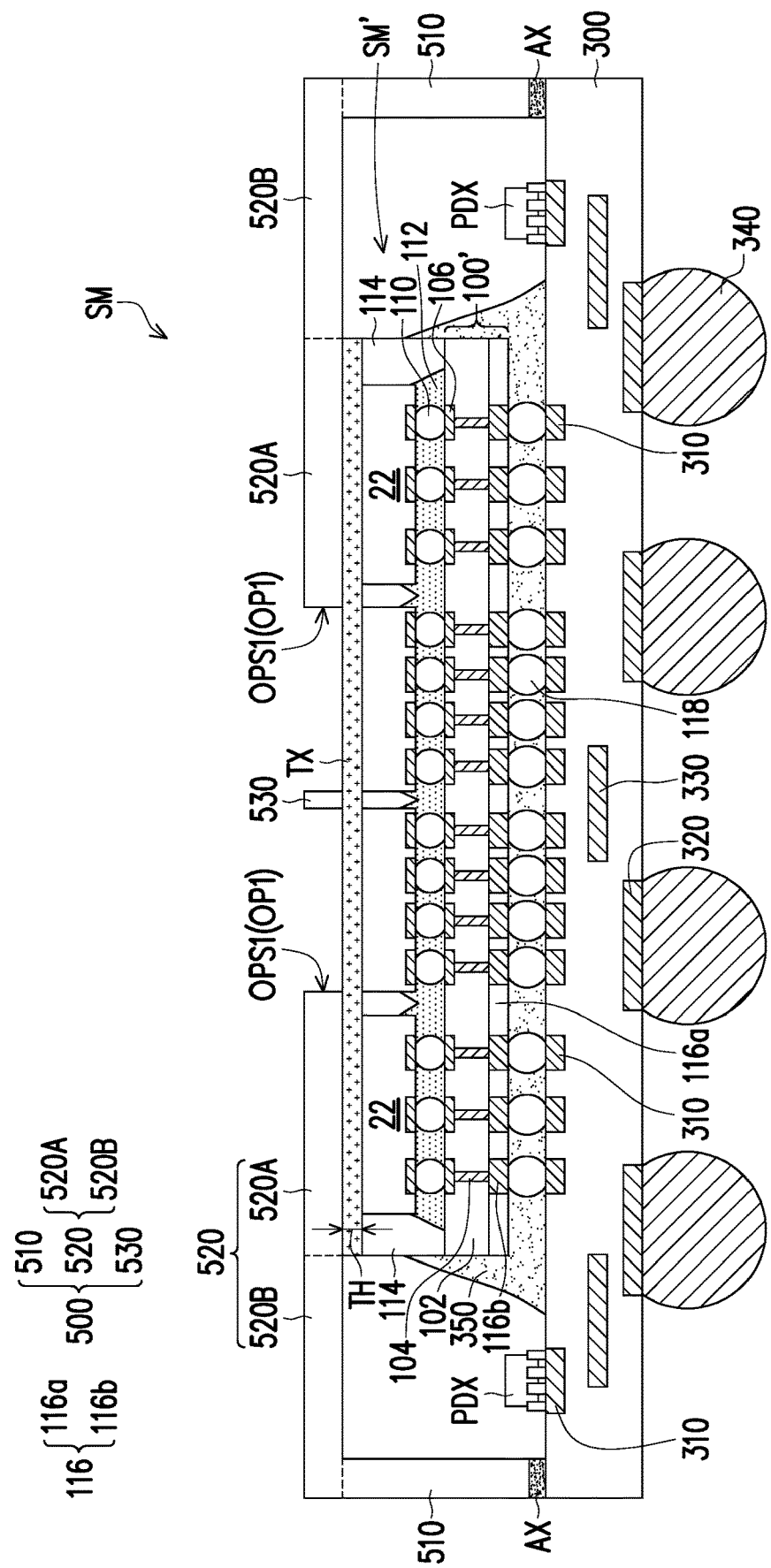
Figure 7B:
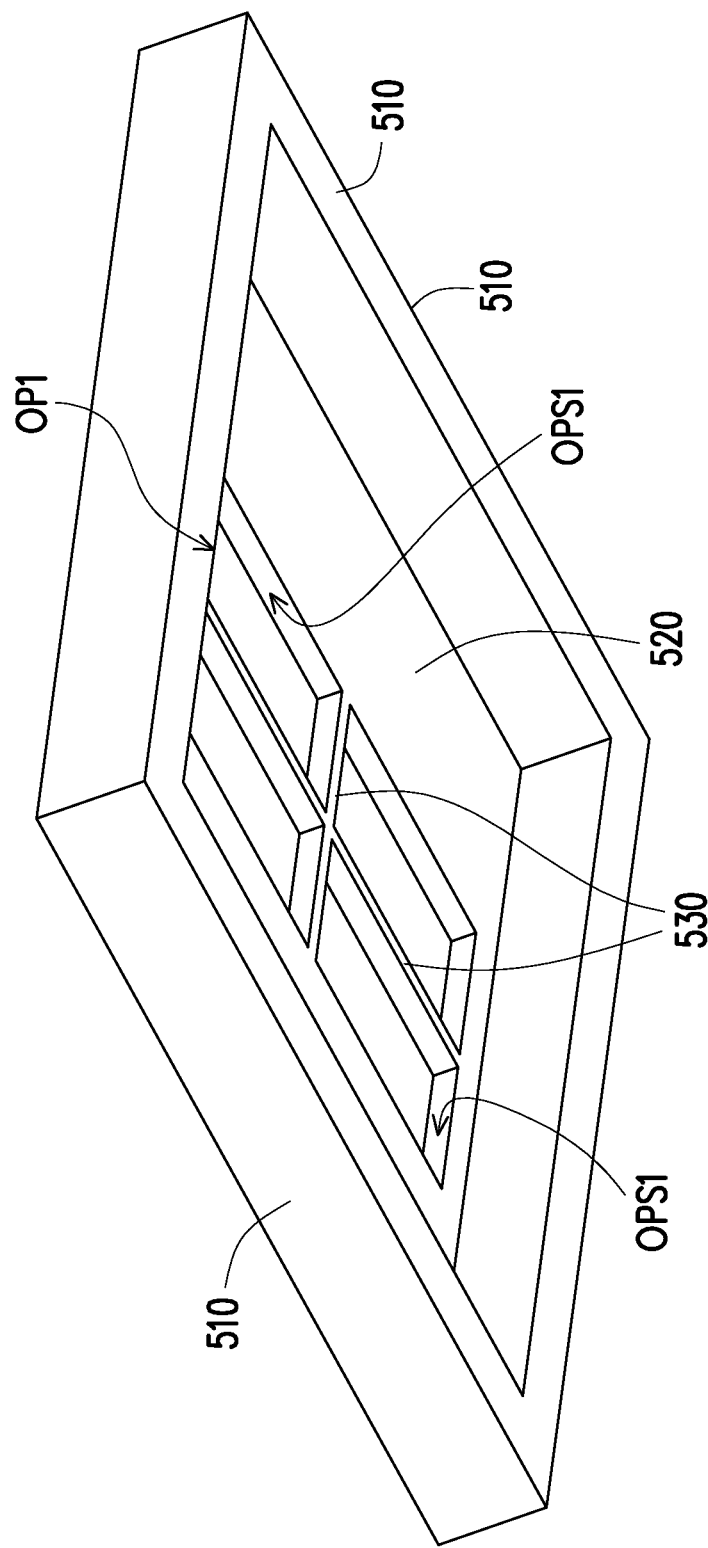
Figure 7C:
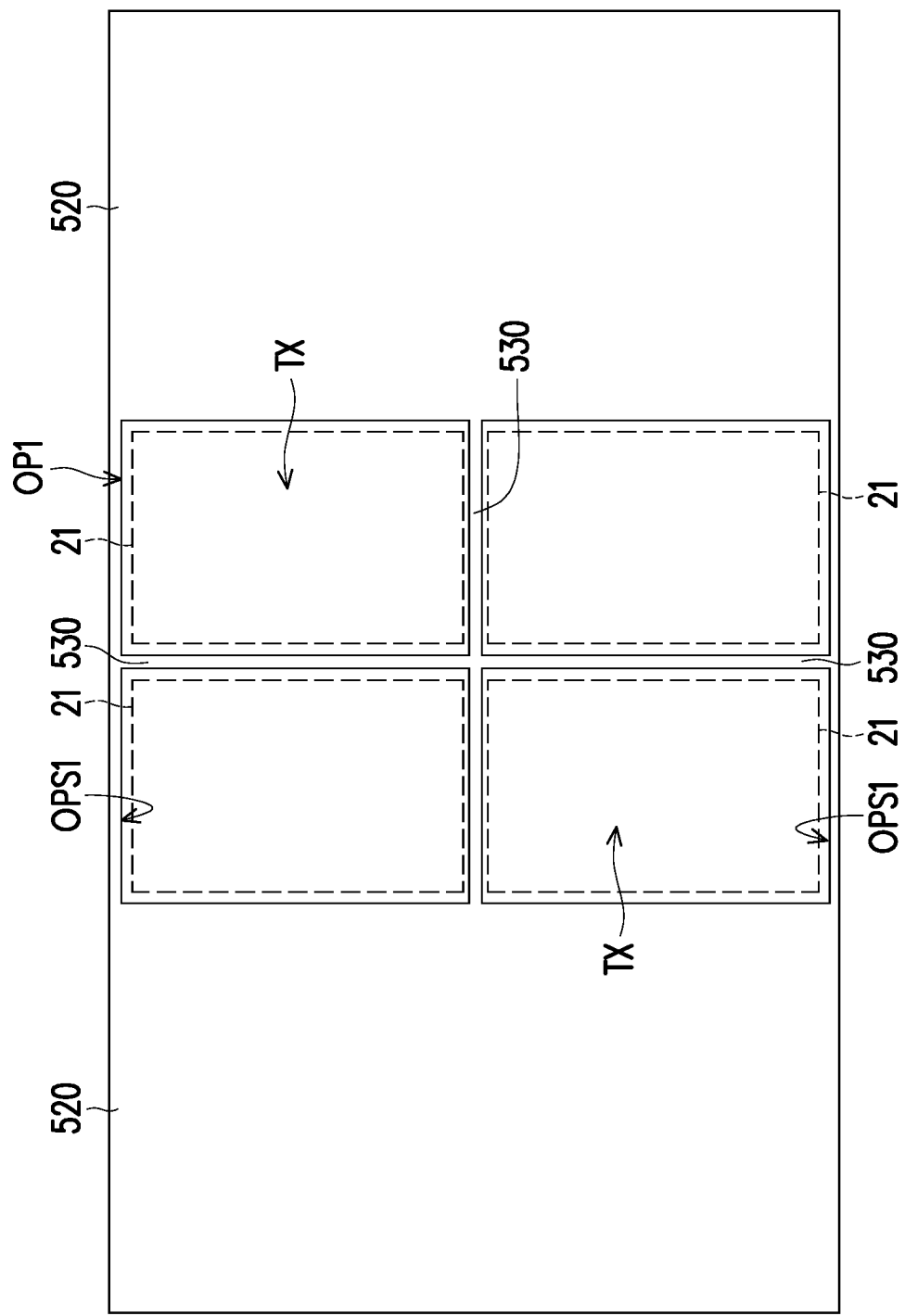

Referring to FIG. 7A, after disposing the semiconductor dies 21 and 22 on the interposer structure 100, the steps illustrated in FIG. 1C to FIG. 1I may be repeated to form a semiconductor package SM'. Thereafter, the obtained semiconductor package SM' may be mounted or attached onto a circuit substrate 300 in a similar way described in FIG. 3. In some embodiments, the thermal interface material TX is mounted on the backside surfaces 21S, 22S of the semiconductor dies 21, 22, while the lid structure 500 is mounted on the circuit substrate 300 to partially cover the thermal interface material TX.

In the exemplary embodiment, the lid structure 500 includes the sidewall part 510, the supporting part 520 and a plurality of sectioning parts 530. The details of the sidewall part 510 and the supporting part 520 have been described with reference to FIG. 4A, thus will not be repeated herein. In some embodiments, referring to FIG. 7A and as illustrated in the three-dimensional view shown in FIG. 7B and the top view shown in FIG. 7C, the sectioning parts 530 of the lid structure 500 defines a plurality of sub-openings OPS1 in the first opening OP1. For example, the sectioning parts 530 are joined with the first portion 520A of the supporting part 520 to define the plurality of sub-openings OPS1. In some embodiments, the first opening OP1 is sectioned into four sub-openings OPS1 by the sectioning parts 530. In certain embodiments, a dimension of the plurality of sub-openings OPS1 corresponds to a dimension of the semiconductor dies 21. In other words, a length and width of each of the sub-openings OPS1 substantially correspond to a length and width of each of the semiconductor die 21 located underneath.

Figure 8A:
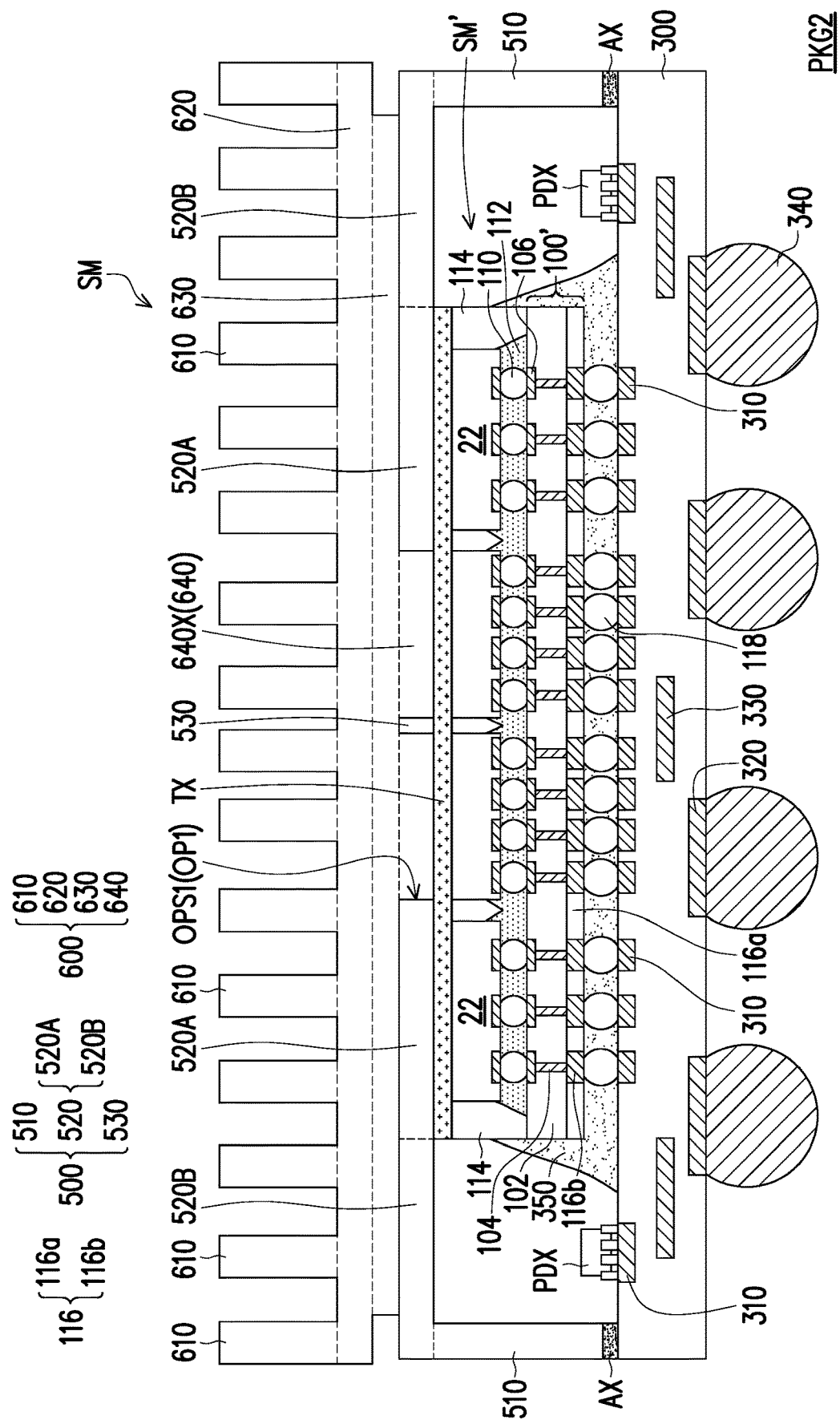
Figure 8B:
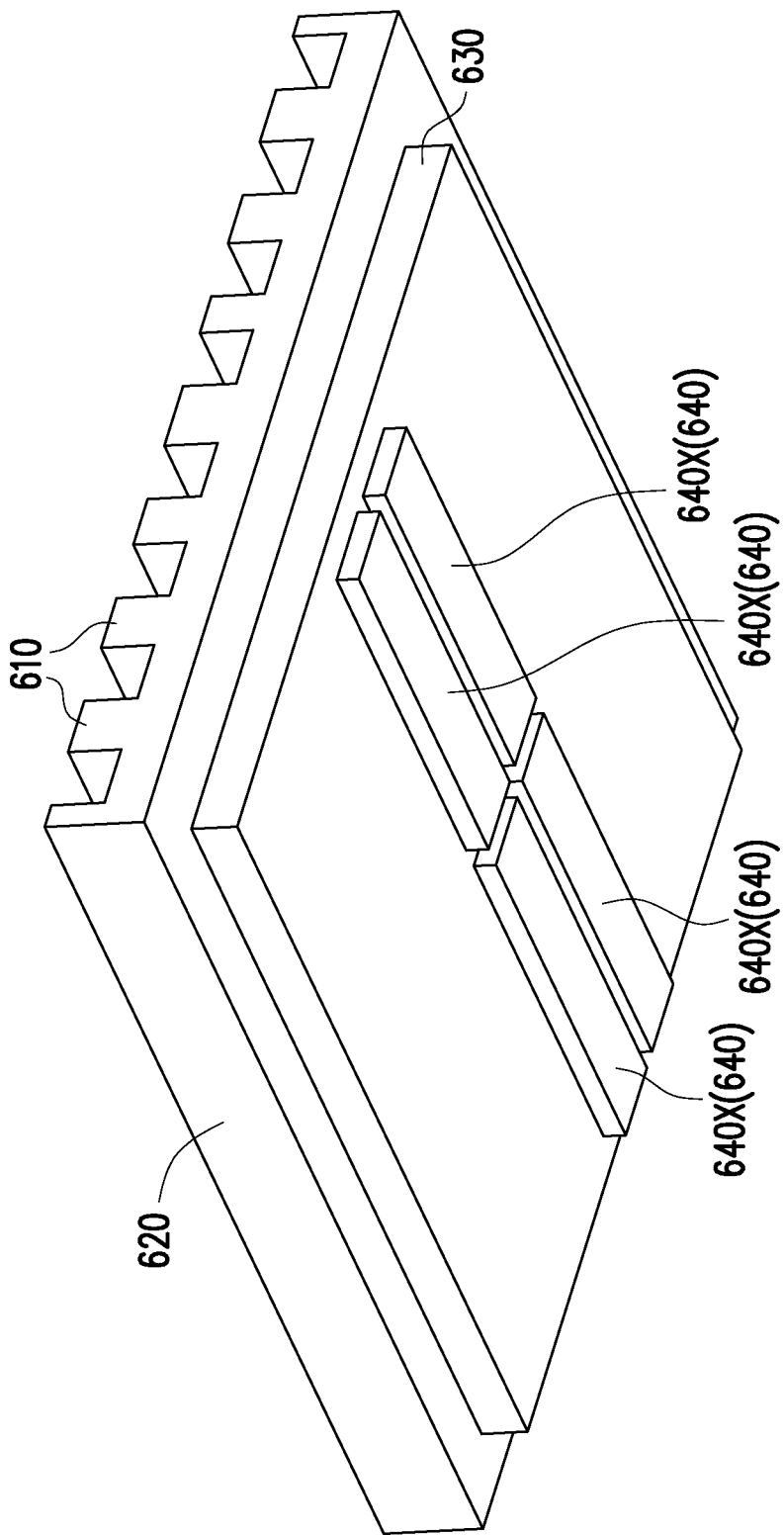

Referring to FIG. 8A, in a subsequent step, a heat dissipation structure 600 is disposed on the lid structure 500. For example, the heat dissipation structure 600 is disposed on the lid structure 500 and in physical contact with the supporting part 520 of the lid structure 500. As illustrated in FIG. 8A, and as shown in the three-dimensional view of the heat dissipation structure 600 shown in FIG. 8B, the heat dissipation structure 600 is a heat sink comprising the fin structures 610, the fin base 620, the step structure 630 and the protruding portion 640 similar to that described in FIG. 5A above. In the exemplary embodiment, the protruding portion 640 of the heat dissipation structure 600 fills into each of the sub-openings OPS1. For example, the protruding portion 640 further includes a plurality of protruding sub-portions 640X that fills into each of the sub-openings OPS1 to contact the thermal interface material TX. The protruding sub-portions 640X are separated from one another by the sectioning parts 530. In certain embodiments, an area of each of the protruding sub-portions OPS1 substantially corresponds to an area occupied by each of the semiconductor dies 21 over the central region 100A (shown in FIG. 1B) of the interposer structure 100'.

After disposing the heat dissipation structure 600 over the lid structure 500, a package structure PKG2 according to some embodiments of the present disclosure is accomplished. In the package structure PKG2 shown in FIG. 8A, the supporting part 520 and the sectioning parts 530 of the lid structure 500 provides an enhanced support to reduce the stress implemented on the semiconductor package SM' and the circuit substrate 300. As such, the stress or force induced on the package may be alleviated, while the warpage of the package structure PKG2 may also be appropriately controlled.

Figure 9A:
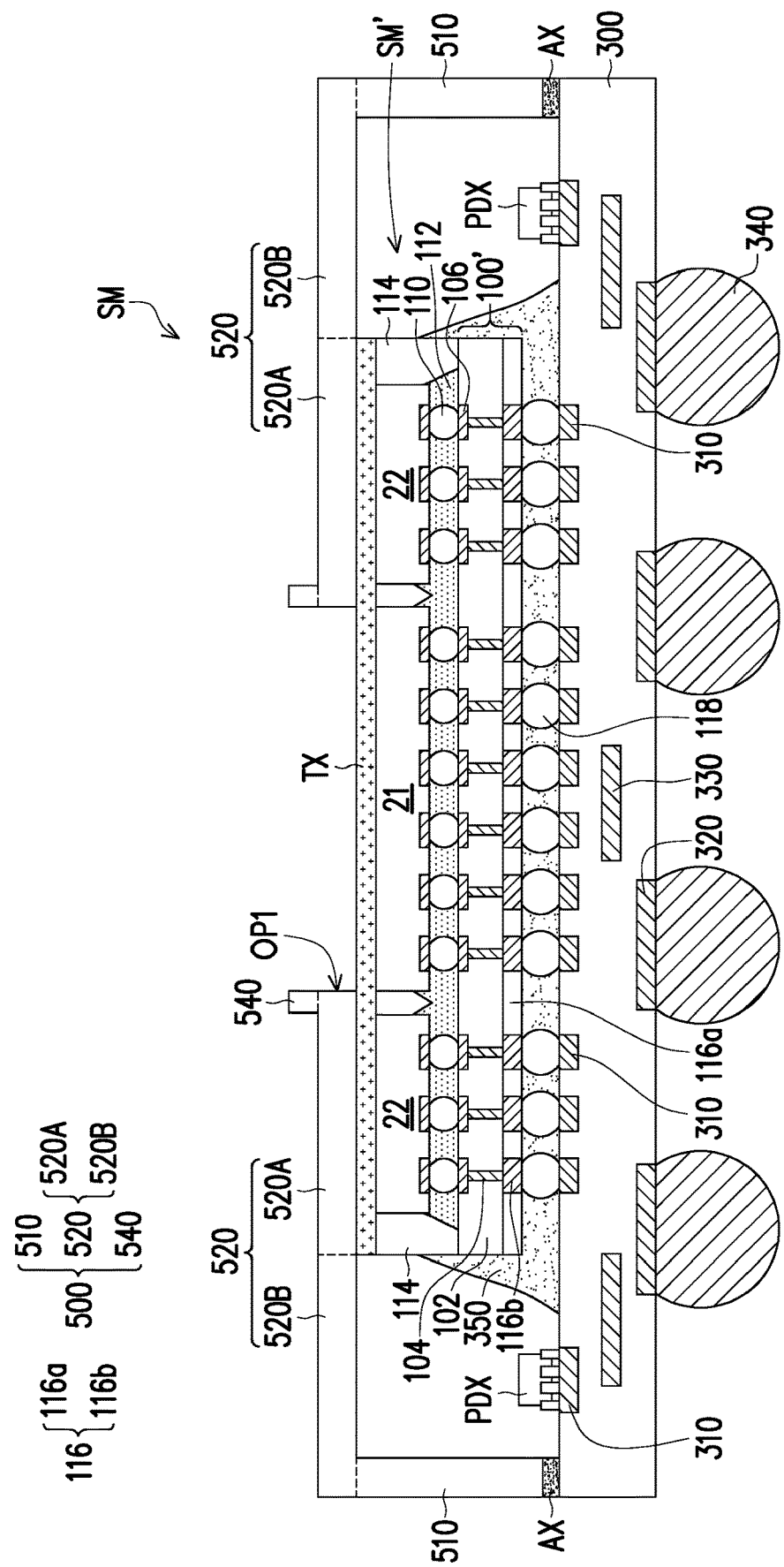
FIG. 9A to FIG. 10B are schematic sectional and three-dimensional views of various stages in a method of fabricating a package structure according to some exemplary embodiments of the present disclosure.
Figure 9B:
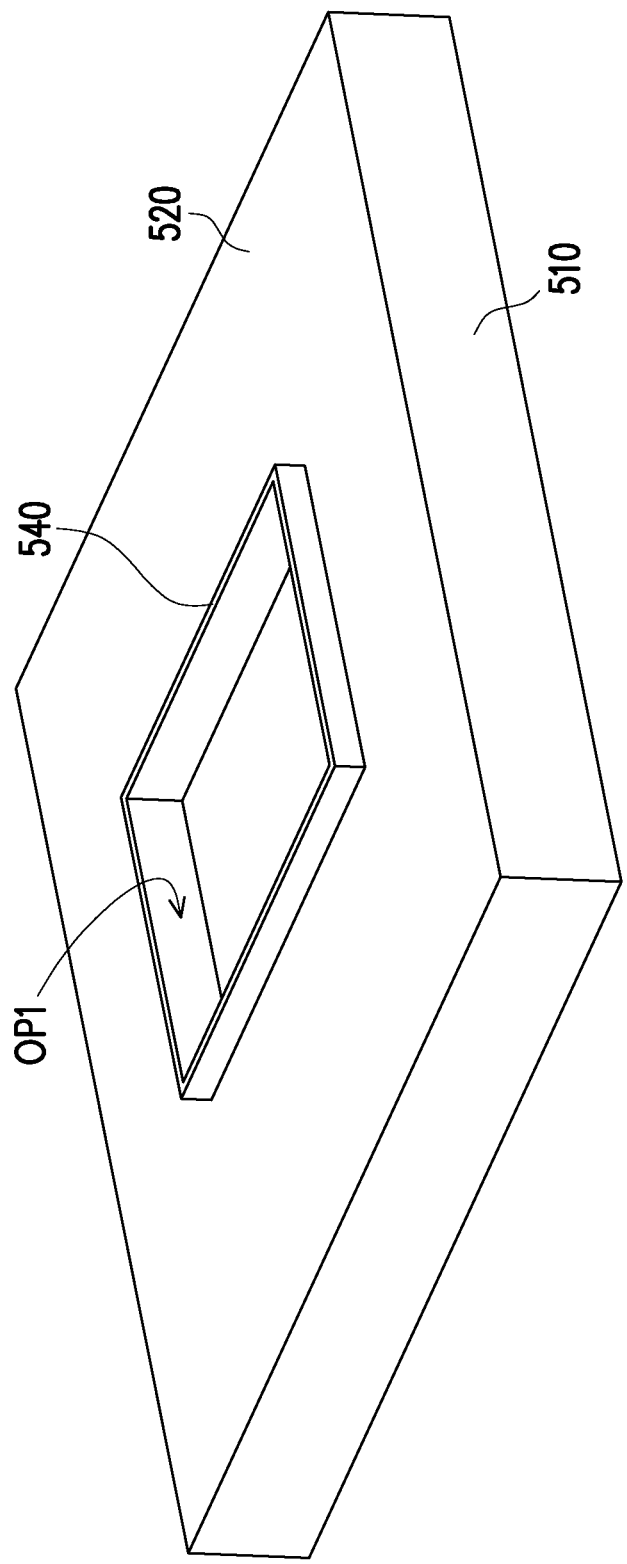
Figure 10A:
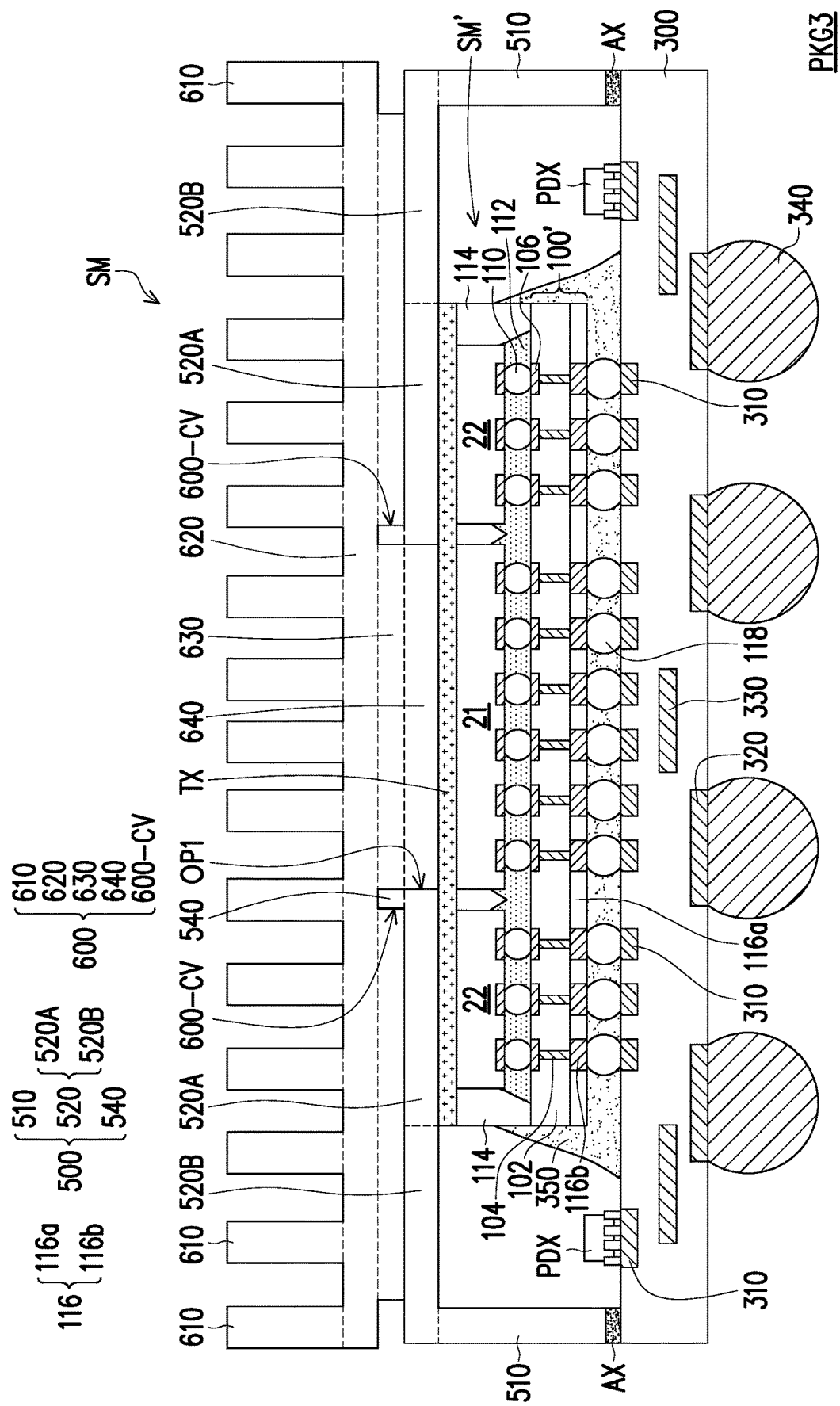
Figure 10B:
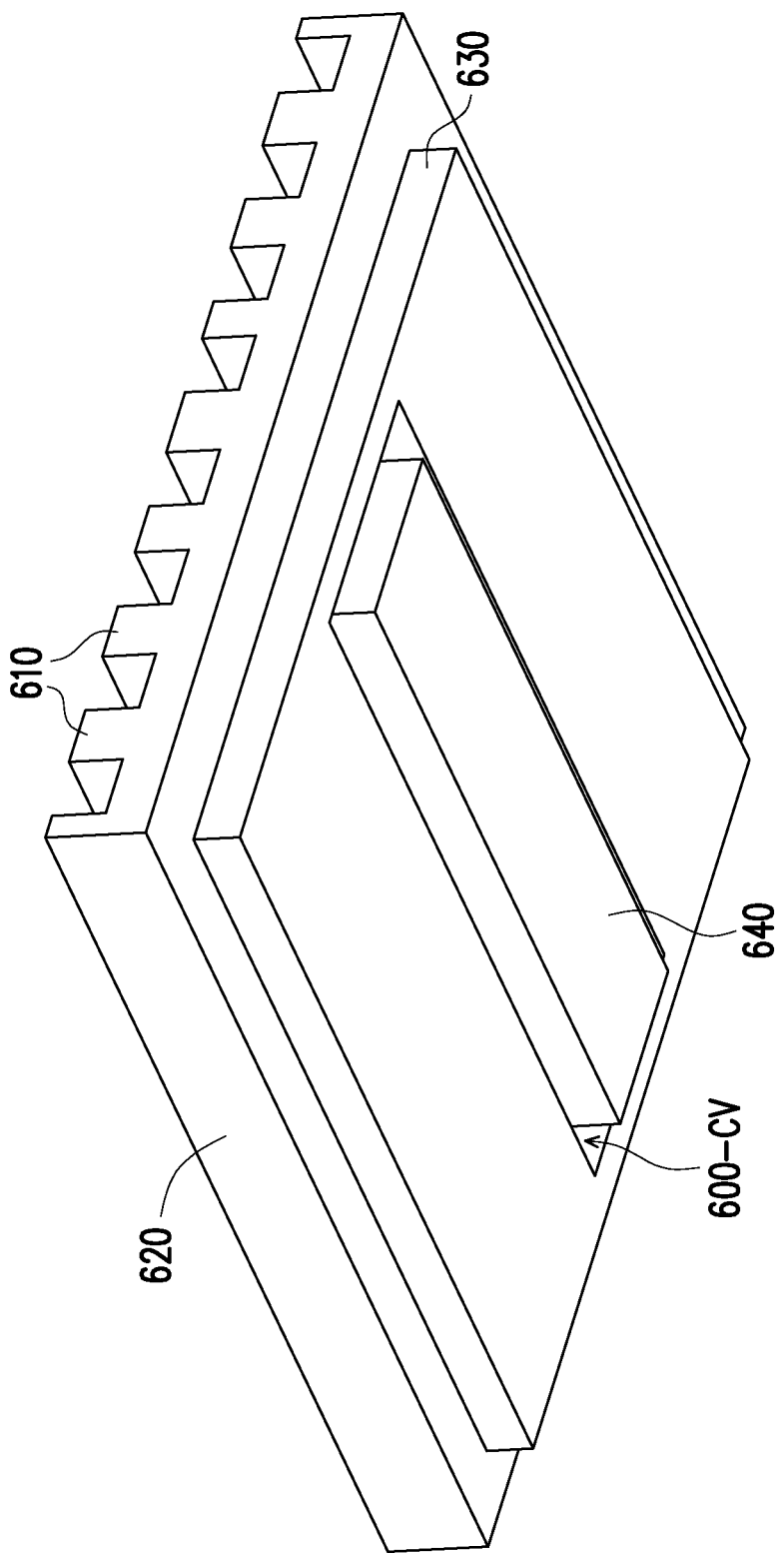
Figure 11:
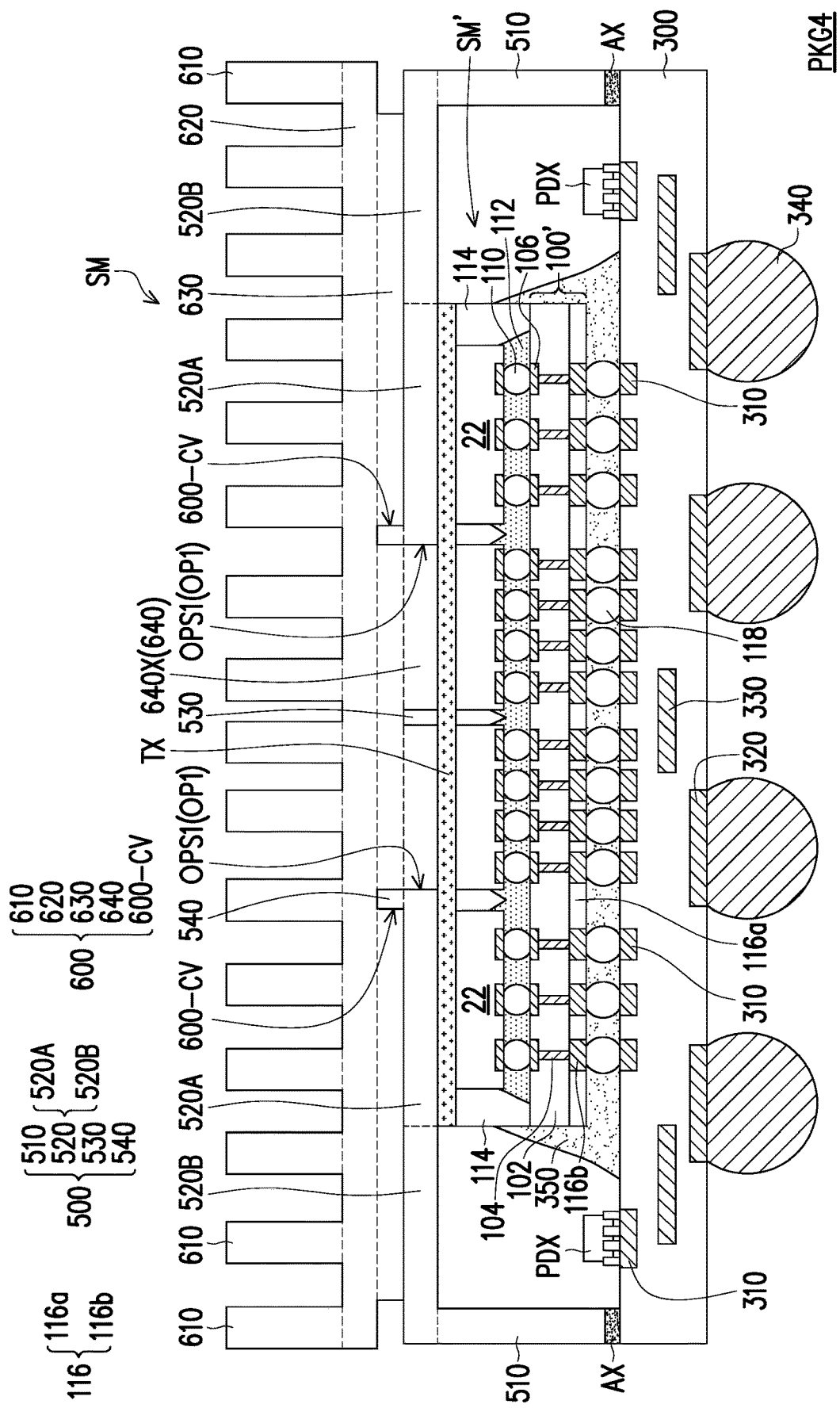

FIG. 9A to FIG. 10B are schematic sectional and three-dimensional views of various stages in a method of fabricating a package structure according to some exemplary embodiments of the present disclosure. The method of fabricating the package structure illustrated in FIG. 9 to FIG. 10B is similar to the method of fabricating the package structure illustrated in FIG. 1A to FIG. 1I and FIG. 3 to FIG. 5B. Therefore, the same reference numerals are used to refer to the same or liked parts, and its detailed description will be omitted herein.

Referring to FIG. 9A, in some embodiments, the steps illustrated in FIG. 1A to FIG. 1I is repeated to form a semiconductor package SM, whereby the obtained semiconductor package SM is mounted or attached onto a circuit substrate 300. In some embodiments, the thermal interface material TX is mounted on the backside surfaces 21S, 22S of the semiconductor dies 21, 22, while the lid structure 500 is mounted on the circuit substrate 300 to partially cover the thermal interface material TX.

In the exemplary embodiment, the lid structure 500 includes the sidewall part 510, the supporting part 520 and a supporting bar 540. The details of the sidewall part 510 and the supporting part 520 have been described with reference to FIG. 4A, thus will not be repeated herein. In some embodiments, referring to FIG. 9A and as illustrated in the three-dimensional view shown in FIG. 9B, the supporting bar 540 is disposed on and protruding out from the supporting part 520. For example, inner sidewalls of the supporting bar 540 are aligned with inner sidewalls of the supporting part 520. In certain embodiments, the first opening OP1 is defined by the sidewalls of the supporting part 520 and the supporting bar 540.

Referring to FIG. 10A, in a subsequent step, a heat dissipation structure 600 is disposed on the lid structure 500. For example, the heat dissipation structure 600 is disposed on the lid structure 500 and filling into the first opening OP1. In some embodiments, the heat dissipation structure 600 is in physical contact with the supporting part 520 and the supporting bar 540 of the lid structure 500. As illustrated in FIG. 10A, and as shown in the three-dimensional view of the heat dissipation structure 600 shown in FIG. 10B, the heat dissipation structure 600 is a heat sink comprising the fin structures 610, the fin base 620, the step structure 630 and the protruding portion 640 as described in FIG. 5A above. In the exemplary embodiment, the heat dissipation structure 600 further includes a concaved portion 600-CV surrounding the protruding portion 640. For example, the supporting bar 540 of the lid structure 500 is protruding towards the concaved portion 600-CV, and filling into the concaved portion 600-CV to surround the protruding portion 640 of the heat dissipation structure 600. In certain embodiments, the step structure 630 further surrounds the supporting bar 540 of the lid structure 500.

After disposing the heat dissipation structure 600 over the lid structure 500, a package structure PKG3 according to some embodiments of the present disclosure is accomplished. In the package structure PKG3 shown in FIG. 10A, the supporting part 520 and the supporting bar 540 of the lid structure 500 provides an enhanced support to reduce the stress implemented on the semiconductor package SM and the circuit substrate 300. As such, the stress or force induced on the package may be alleviated, while the warpage of the package structure PKG3 may also be appropriately controlled.

Figure 11:
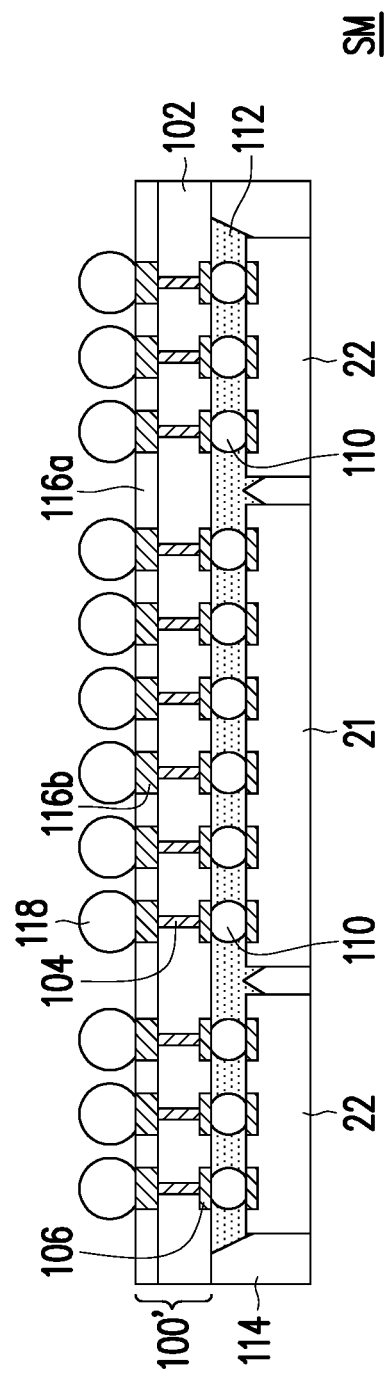
FIG. 11 is a schematic sectional view of a package structure according to some other exemplary embodiments of the present disclosure.

FIG. 11 is a schematic sectional view of a package structure according to some other exemplary embodiments of the present disclosure. The package structure PKG4 illustrated in FIG. 11 is similar to the package structure PKG3 illustrated in FIG. 10A. Therefore, the same reference numerals are used to refer to the same or liked parts, and its detailed description will be omitted herein. The difference between the embodiments is that the lid structure 500 of FIG. 11 includes the sidewall part 510, the supporting part 520, the sectioning parts 530 and the supporting bar 540.

For example, referring to the package structure PKG4 illustrated in FIG. 11, the lid structure 500 is disposed on the circuit substrate 300 to surround the semiconductor package SM' and to partially cover the thermal interface material TX. In some embodiments, the sectioning parts 530 of the lid structure 500 defines a plurality of sub-openings OPS1 in the first opening OP1 (similar to that shown in FIG. 7B). Furthermore, the supporting bar 540 is disposed on and protruding out from the supporting part 520. In some embodiments, the heat dissipation structure 600 of FIG. 11 further includes a concaved portion 600-CV surrounding the protruding portion 640. For example, the supporting bar 540 of the lid structure 500 is protruding towards the concaved portion 600-CV, and filling into the concaved portion 600-CV to surround the protruding portion 640 of the heat dissipation structure 600. Furthermore, the protruding portion 640 of the heat dissipation structure 600 further includes a plurality of protruding sub-portions 640X that fills into each of the sub-openings OPS1 to contact the thermal interface material TX.

After disposing the heat dissipation structure 600 over the lid structure 500, a package structure PKG4 according to some embodiments of the present disclosure is accomplished. In the package structure PKG4 shown in FIG. 11, the supporting part 520, the sectioning parts 530 and the supporting bar 540 of the lid structure 500 provides a further enhanced support to reduce the stress implemented on the semiconductor package SM and the circuit substrate 300. As such, the stress or force induced on the package may be alleviated, while the warpage of the package structure PKG4 may also be appropriately controlled.

Figure 12A:
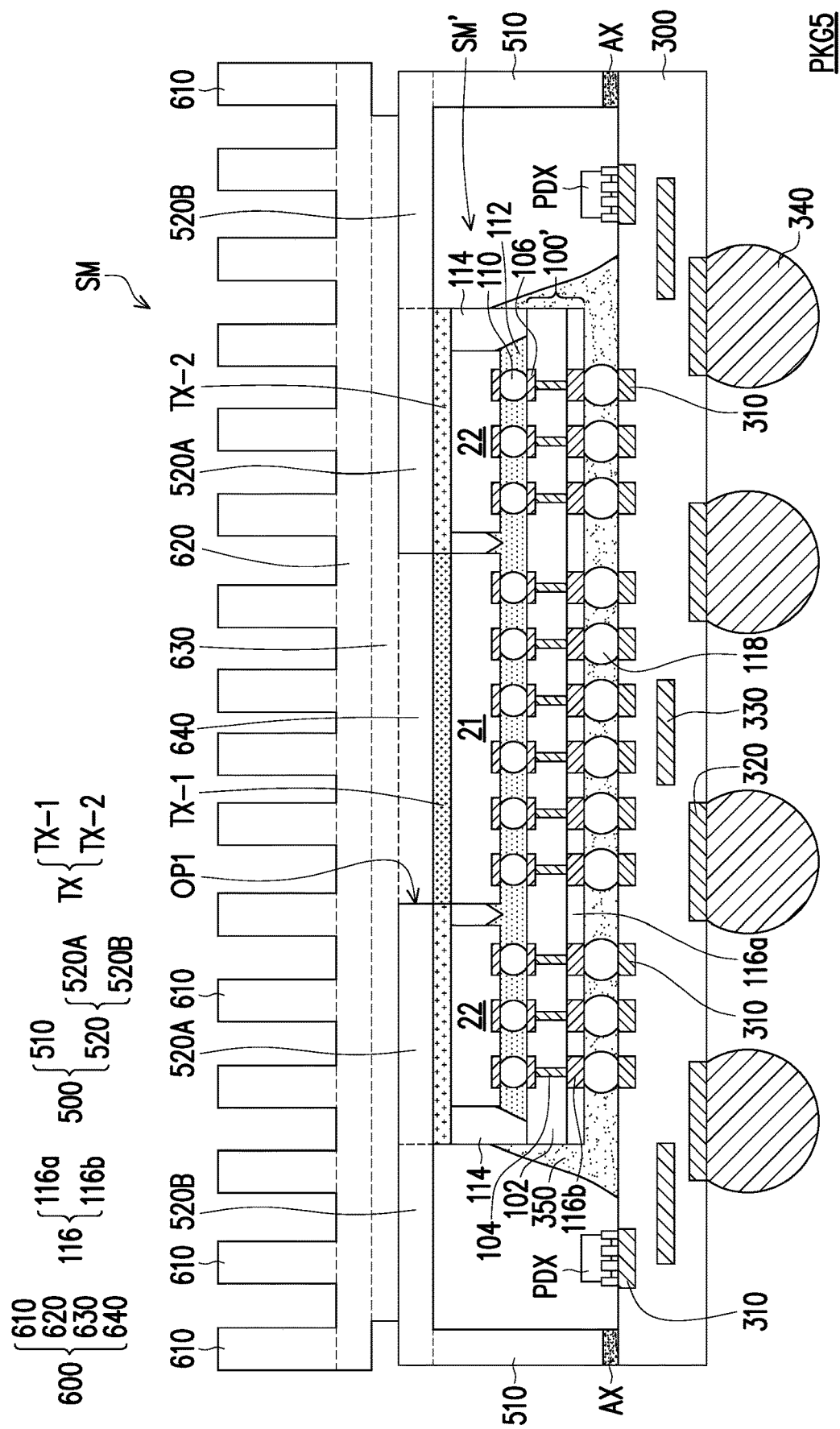
FIG. 12A is a schematic sectional view of a package structure according to some other exemplary embodiments of the present disclosure.
Figure 12B:
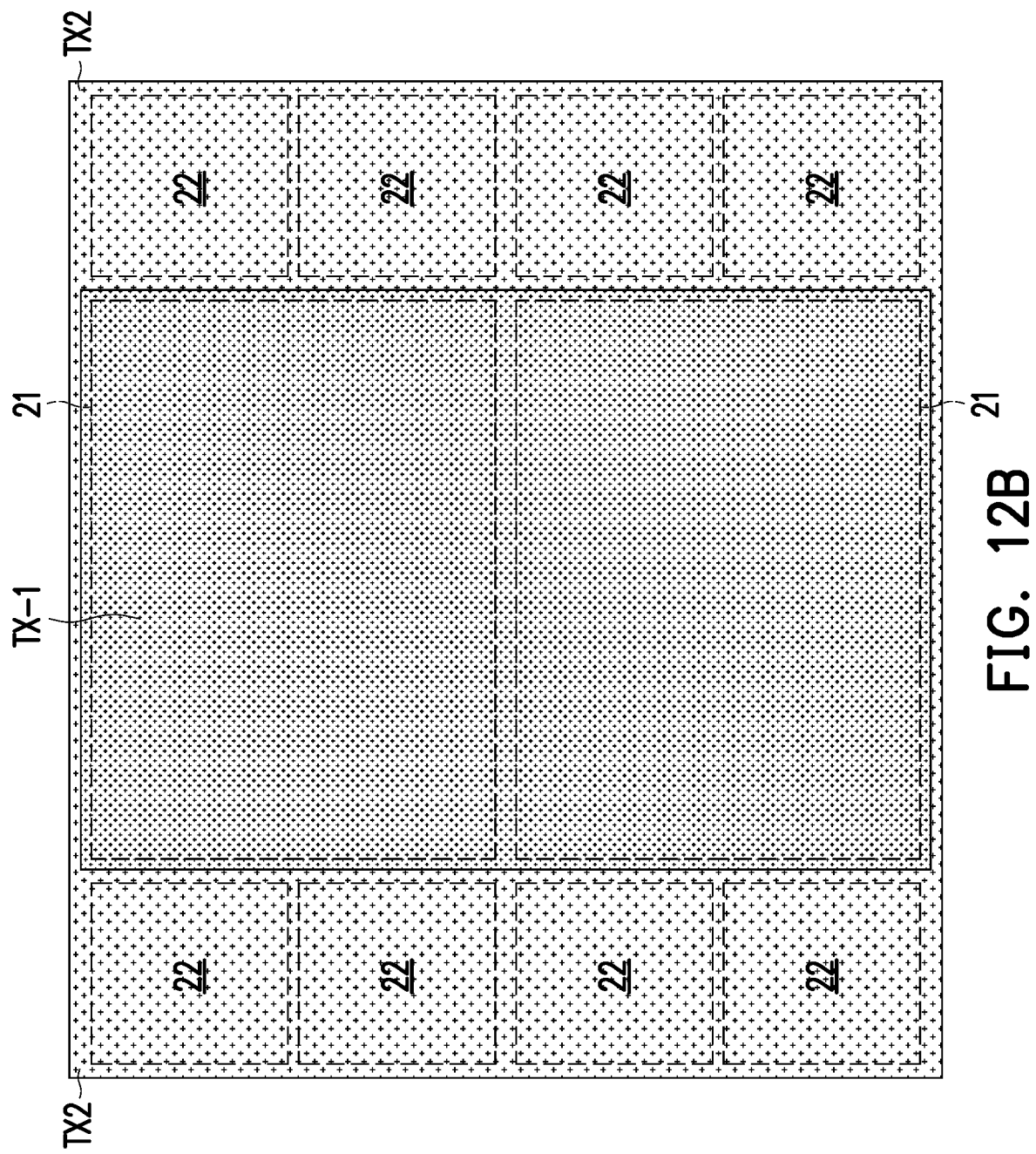
FIG. 12B is a top view of a thermal interface material in the package structure of FIG. 12A.

FIG. 12A is a schematic sectional view of a package structure according to some other exemplary embodiments of the present disclosure. FIG. 12B is a top view of a thermal interface material in the package structure of FIG. 12A. The package structure PKG5 illustrated in FIG. 12A is similar to the package structure PKG1 illustrated in FIG. 5A. Therefore, the same reference numerals are used to refer to the same or liked parts, and its detailed description will be omitted herein. The difference between the embodiments is that the thermal interface material TX of FIG. 12A and FIG. 12B further includes a first thermal interface material TX-1 and a second thermal interface material TX-2.

As illustrated in FIG. 12A, and from the top view illustrated in FIG. 12B, the thermal interface material TX includes a first thermal interface material TX-1 covering the semiconductor dies 21 and a second thermal interface material TX-2 covering the semiconductor dies 22. For example, the first thermal interface material TX-1 is in physical contact with the semiconductor dies 21 and the protruding portion 640 of the heat dissipation structure 600. Furthermore, the second thermal interface material TX-2 is in physical contact with the second semiconductor dies 22 and the supporting part 520 (first portion 520A) of the lid structure 500. In some embodiments, the heat transfer coefficient of the first thermal interface material TX-1 is greater than the heat transfer coefficient of the second thermal interface material TX-2. For example, the first thermal interface material TX-1 has a heat transfer coefficient of greater than 20 W/mK, and the second thermal interface material TX-2 has a heat transfer coefficient of greater than 3 W/mK and less than 20 W/mK. In certain embodiments, the second thermal interface material TX-2 is surrounding the first thermal interface material TX-1. In some embodiments, the dimensions of the first opening OP1 of the lid structure 500 substantially correspond to a dimension of the first thermal interface material TX-1. In other words, the first opening OP1 reveals the first thermal interface material TX-1 and does not reveal the second thermal interface material TX-2.

Similar to the above embodiments, in the package structure PKG5 shown in FIG. 12A, the supporting part 520 of the lid structure 500 provides an enhanced support to reduce the stress implemented on the semiconductor package SM and the circuit substrate 300. As such, the stress or force induced on the package may be alleviated, while the warpage of the package structure PKG5 may also be appropriately controlled. Furthermore, the use the first thermal interface material TX-1 (heat transfer coefficient of <20 W/mK) to selectively cover the semiconductor dies 21 provides a better heat dissipation effect to the semiconductor dies 21 (logic dies).

Figure 13A:
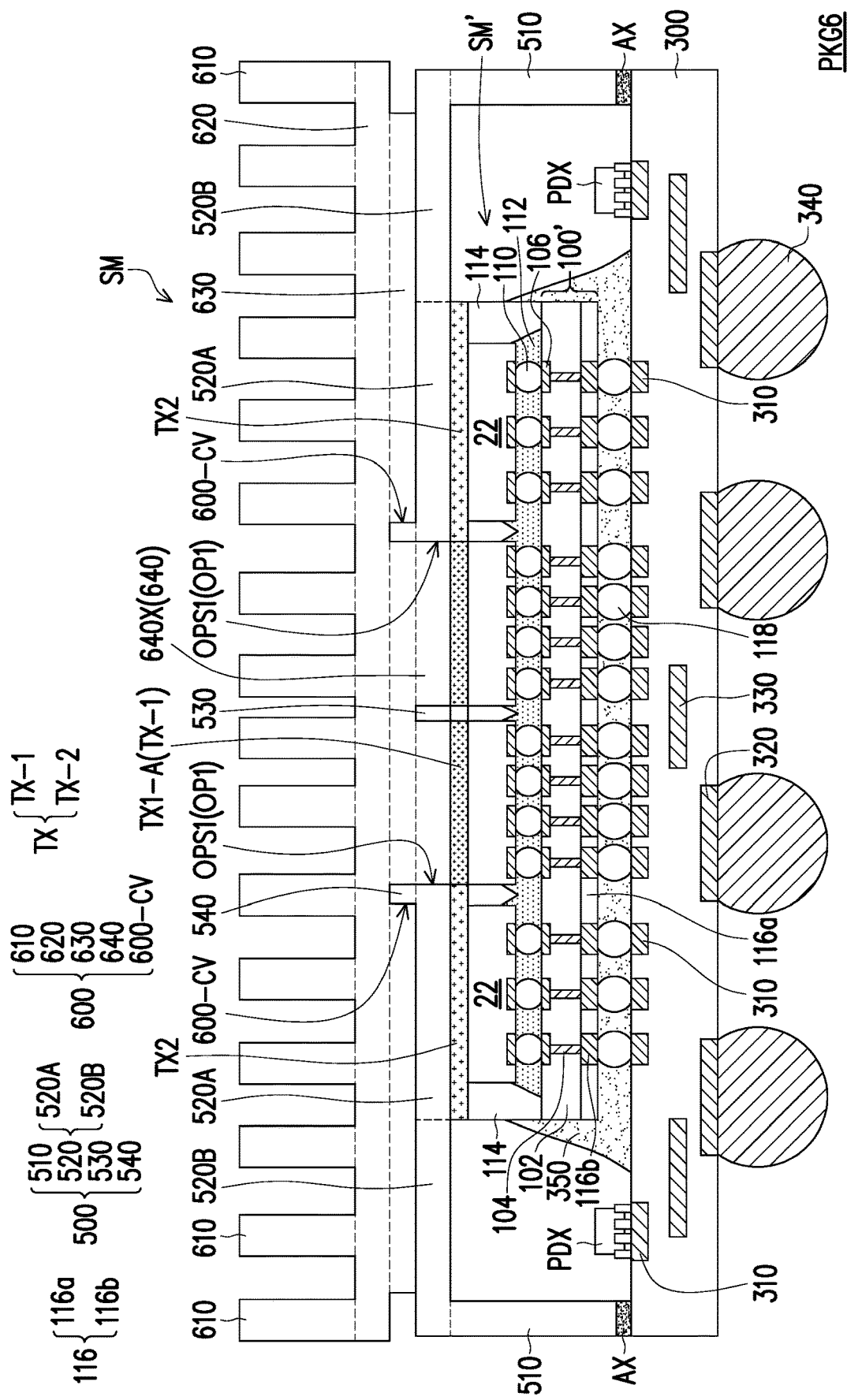
FIG. 13A is a schematic sectional view of a package structure according to some other exemplary embodiments of the present disclosure.
Figure 13B:
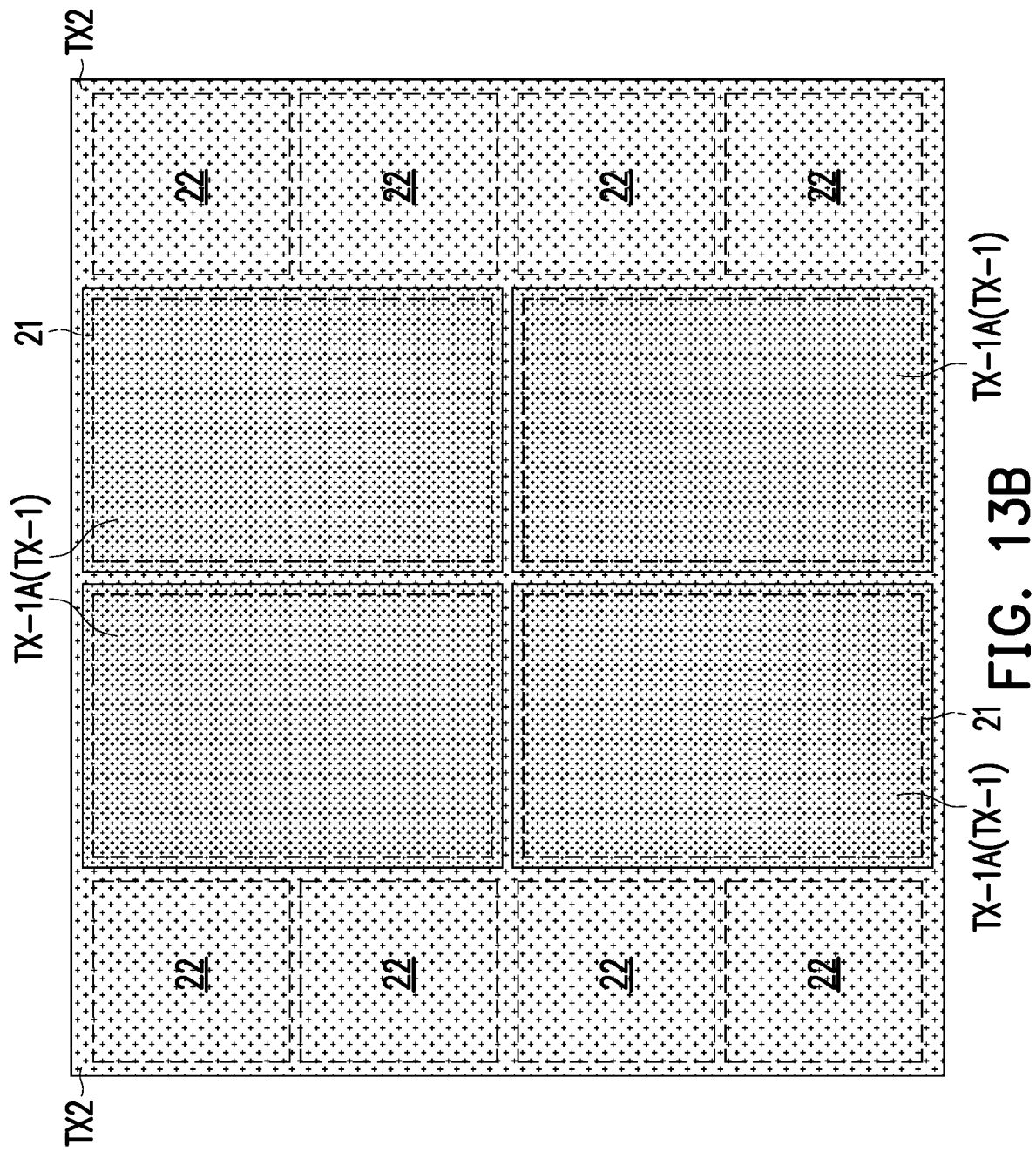
FIG. 13B is a top view of a thermal interface material in the package structure of FIG. 13A.

FIG. 13A is a schematic sectional view of a package structure according to some other exemplary embodiments of the present disclosure. FIG. 13B is a top view of a thermal interface material in the package structure of FIG. 13A. The package structure PKG6 illustrated in FIG. 13A is similar to the package structure PKG2 illustrated in FIG. 8A. Therefore, the same reference numerals are used to refer to the same or liked parts, and its detailed description will be omitted herein. The difference between the embodiments is that the thermal interface material TX of FIG. 13A and FIG. 13B further includes a first thermal interface material TX-1 and a second thermal interface material TX-2.

As illustrated in FIG. 13A, and from the top view illustrated in FIG. 13B, the thermal interface material TX includes a first thermal interface material TX-1 covering the semiconductor dies 21, and a second thermal interface material TX-2 covering the semiconductor dies 22 and surrounding the first thermal interface material TX-1. In the exemplary embodiment, the lid structure 500 includes a plurality of sectioning parts 530 that define the sub-openings OPS1. In some embodiments, the first thermal interface material TX-1 includes a plurality of first thermal interface material sections TX-1A corresponding to the sub-openings OPS1. In other words, a dimension of each of the first thermal interface material sections TX-1A substantially correspond to the dimension of each of the sub-openings OPS1. In certain embodiments, a length and width of the first thermal interface material sections TX-1A substantially corresponds to a length and width of each of the semiconductor die 21 located underneath. In some embodiments, the first thermal interface material TX-1 is in physical contact with the semiconductor dies 21 and the protruding portion 640 (protruding sub-portions 640X) of the heat dissipation structure 600. Furthermore, the second thermal interface material TX-2 is in physical contact with the second semiconductor dies 22, the supporting part 520 (first portion 520A) and the sectioning parts 530 of the lid structure 500.

Similar to the above embodiments, in the package structure PKG6 shown in FIG. 13A, the supporting part 520, the sectioning parts 530 and the supporting bar 540 of the lid structure 500 provides a further enhanced support to reduce the stress implemented on the semiconductor package SM' and the circuit substrate 300. As such, the stress or force induced on the package may be alleviated, while the warpage of the package structure PKG6 may also be appropriately controlled. Furthermore, the use the first thermal interface material TX-1 (heat transfer coefficient of <20 W/mK) to selectively cover the semiconductor dies 21 provides a better heat dissipation effect to the semiconductor dies 21 (logic dies).

Figure 14:
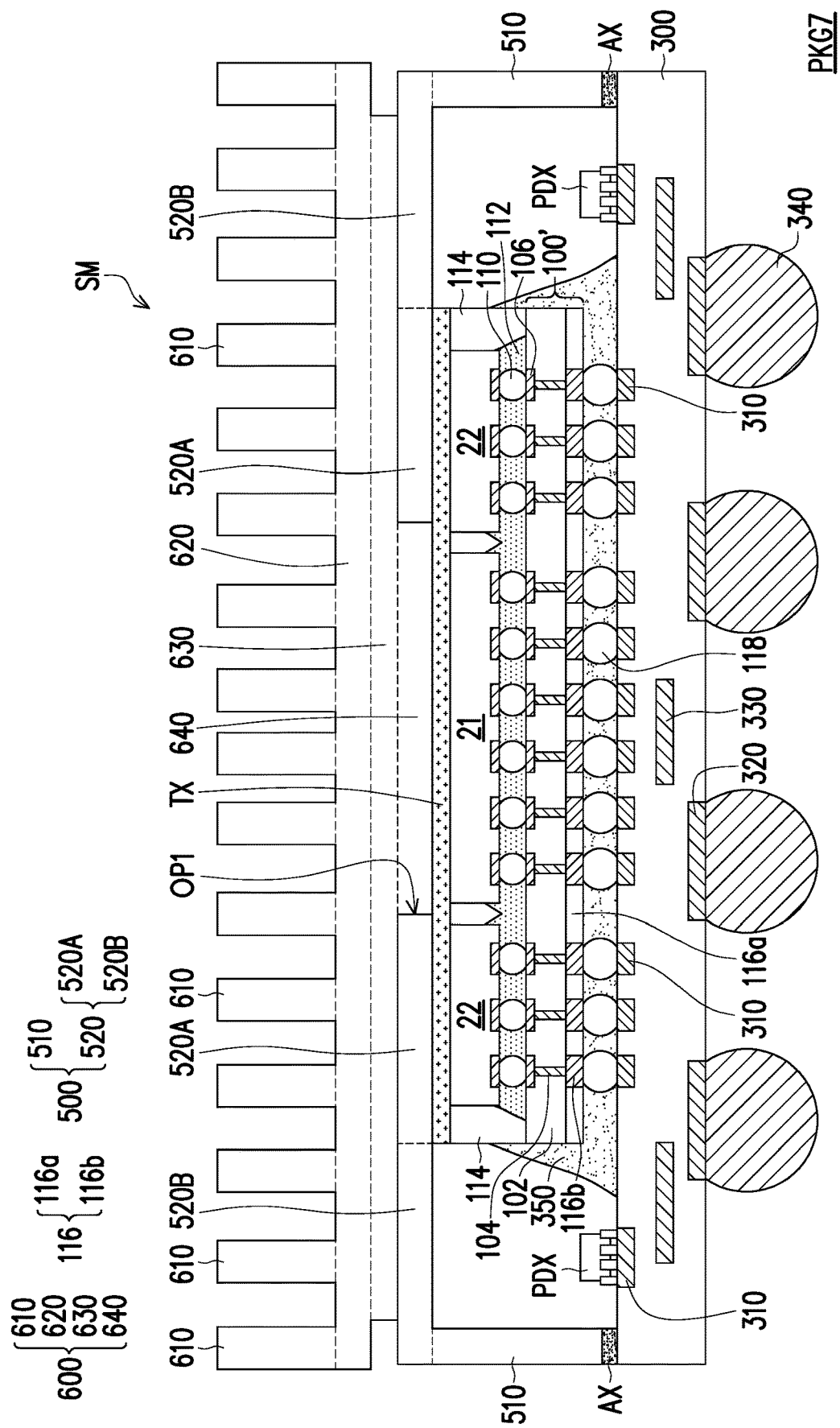
FIG. 14 is a schematic sectional view of a package structure according to some other exemplary embodiments of the present disclosure.
Figure 15A:
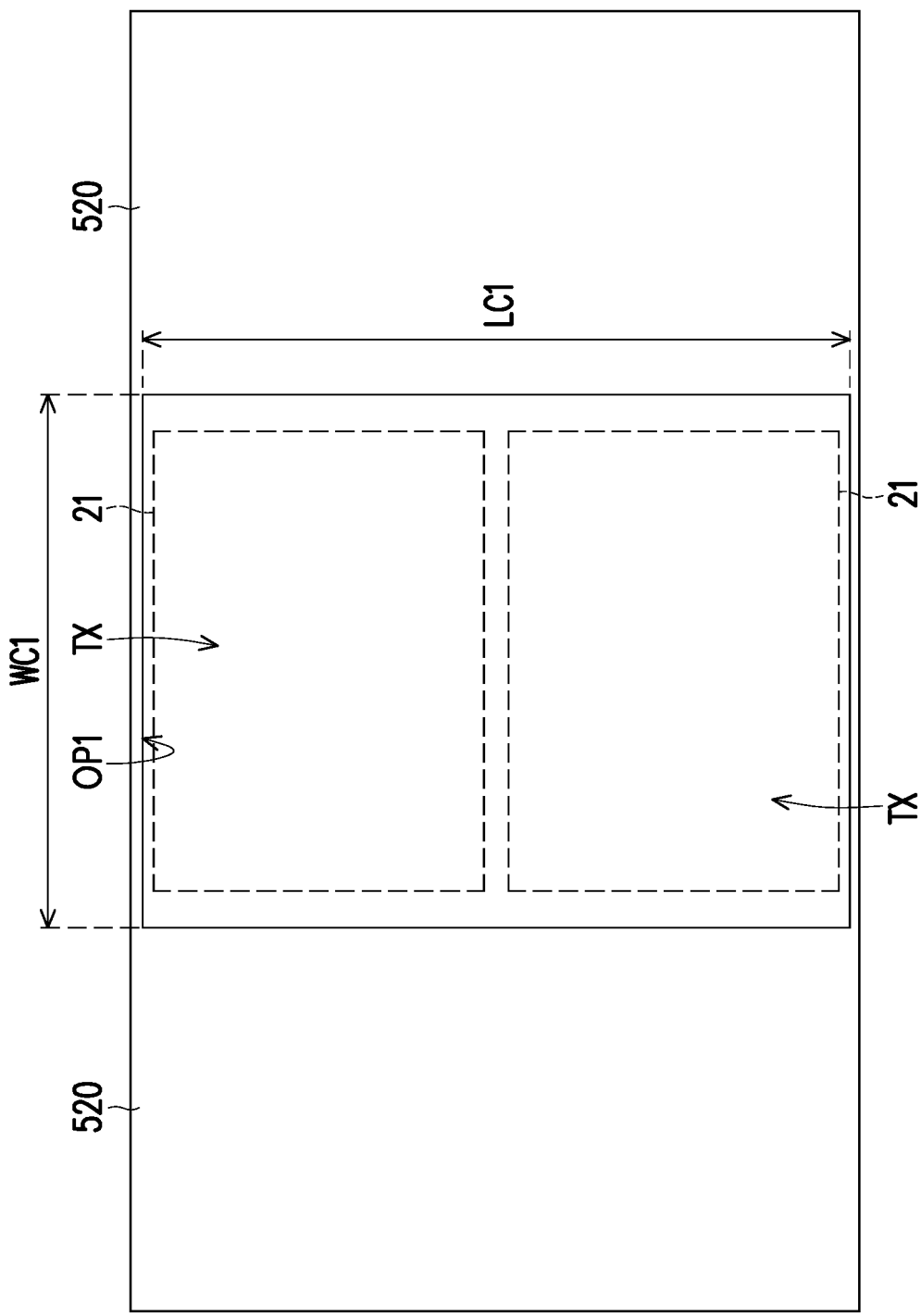
FIG. 15A to FIG. 15B are schematic top views of various design of a lid structure according to the package structure of FIG. 14.
Figure 15B:
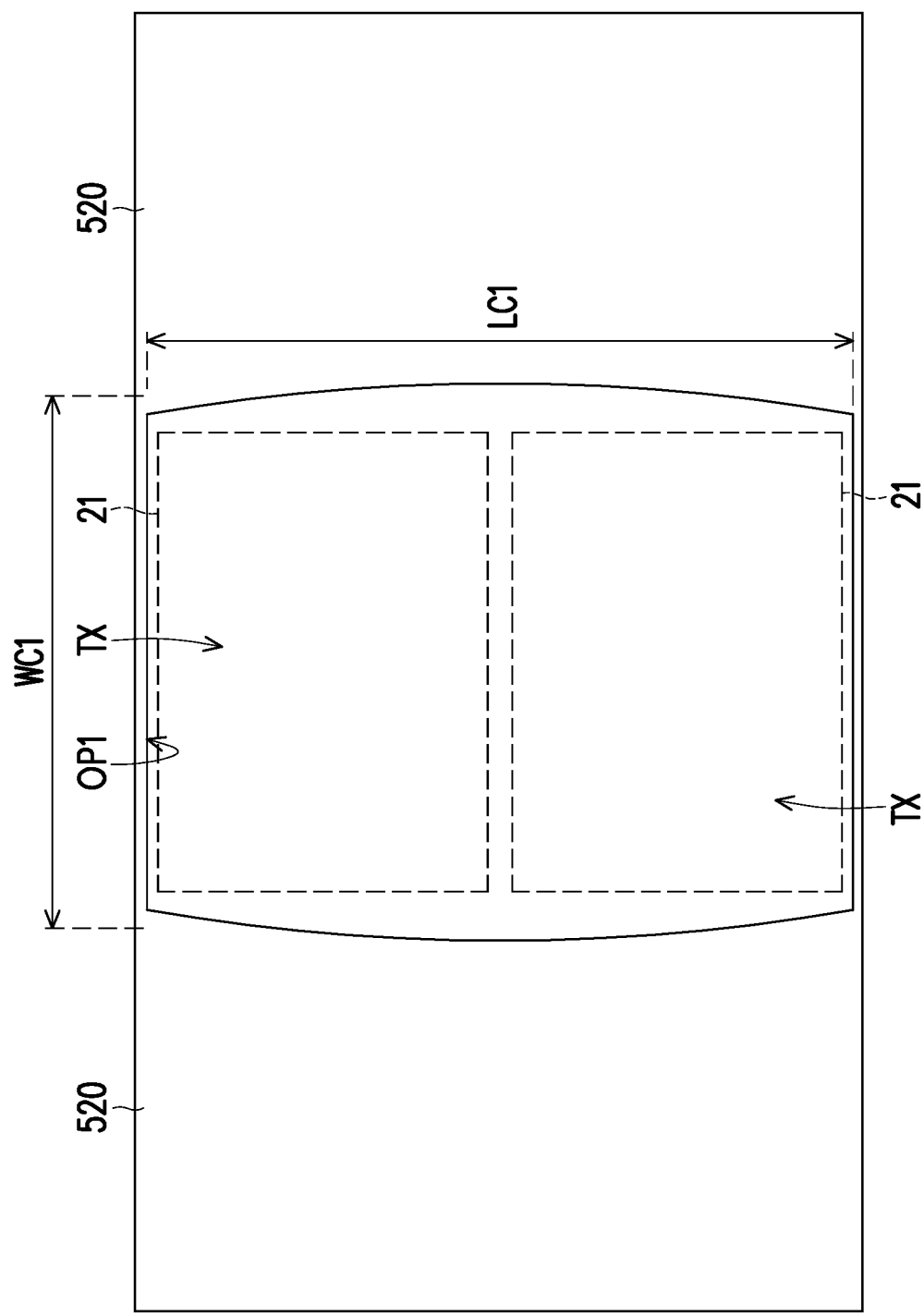

FIG. 14 is a schematic sectional view of a package structure according to some other exemplary embodiments of the present disclosure. FIG. 15A to FIG. 15B are schematic top views of various design of a lid structure according to the package structure of FIG. 14. The package structure PKG7 illustrated in FIG. 14 is similar to the package structure PKG1 illustrated in FIG. 5A. Therefore, the same reference numerals are used to refer to the same or liked parts. The difference between the embodiments is in the design of the lid structure 500. In the package structure PKG1 of FIG. 5A, an area of the first opening OP1 substantially corresponds to an area occupied by the first semiconductor dies 21. However, the disclosure is not limited thereto. For example, as illustrated in the package structure PKG7 of FIG. 14, an area of the first opening OP1 is greater than an area occupied by the first semiconductor dies 21.

Referring to FIG. 15A and FIG. 15B, in the embodiments where the area of the first opening OP1 is greater than an area occupied by the first semiconductor dies 21, the lid structure 500 may be designed so that the width WC1 and/or the length LC1 may be respectively larger than a sum of the widths and a sum of the lengths of the two first semiconductor dies 21 located underneath. In some embodiments, the first opening OP1 is designed to have a rectangular shape (FIG. 15A), but the disclosure is not limited thereto. In some embodiments, the first opening OP1 is designed to have an oval-like shape (FIG. 15B), whereby the supporting part 520 of the lid structure have curved sidewalls to define the first opening OP1. In other words, the design of the first opening OP1 may be appropriately adjusted as long as the lid structure 500 still includes the supporting part 520 to reduce the stress implemented on the semiconductor package SM.

Similar to the above embodiments, in the package structure PKG7 shown in FIG. 14, the supporting part 520 provides an enhanced support to reduce the stress implemented on the semiconductor package SM and the circuit substrate 300. As such, the stress or force induced on the package may be alleviated, while the warpage of the package structure PKG7 may also be appropriately controlled. However, as compared with the package structure PKG1 with smaller first opening OP1, the greater first opening OP1 of the package structure PKG7 may maintain the heat dissipation effect, but the stress alleviating effect might be slightly reduced.

Figure 16:
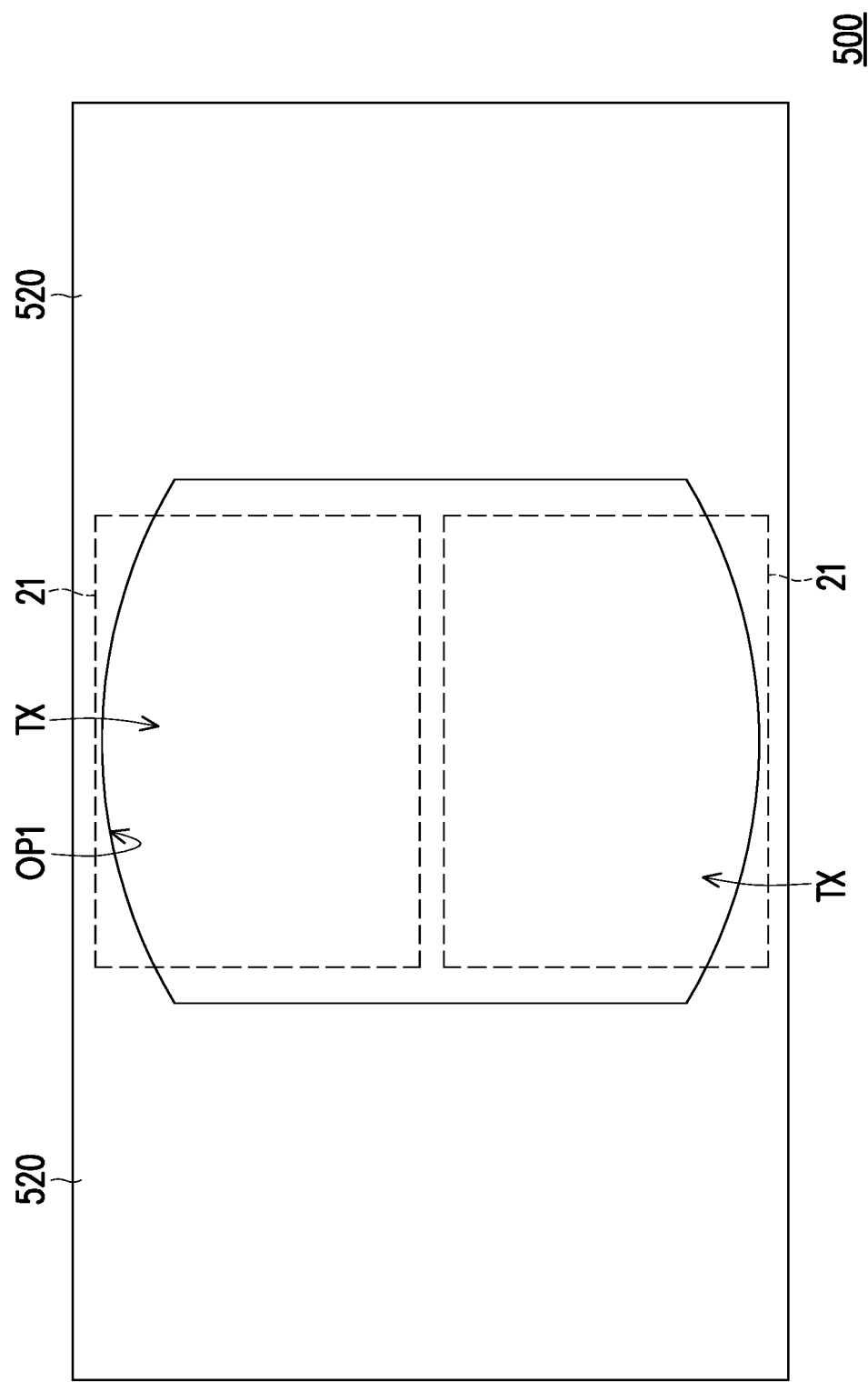
FIG. 16 is a schematic top view of another design of a lid structure according to some exemplary embodiments of the present disclosure.

FIG. 16 is a schematic top view of another design of a lid structure according to some exemplary embodiments of the present disclosure. The lid structure 500 illustrated in FIG. 16 is similar to the lid structure 500 illustrated in FIG. 15A and FIG. 15B. Therefore, the same reference numerals are used to refer to the same or liked parts, and its detailed description will be omitted herein. In the previous embodiment, the lid structure 500 is designed so that an area of the first opening OP1 substantially corresponds to, or is greater than an area occupied by the first semiconductor dies 21. However, the disclosure is not limited thereto. For example, as illustrated in the lid structure 500 of FIG. 16, an area of the first opening OP1 is smaller than an area occupied by the first semiconductor dies 21.

Similar to the above embodiments, the lid structure 500 of FIG. 16 provides an enhanced support to reduce the stress implemented on the semiconductor package SM and the circuit substrate 300. As such, the stress or force induced on the package may be alleviated, while the warpage of the package structure may also be appropriately controlled. However, as compared with the package structure PKG1 having a lid structure 500 with greater first opening OP1, the smaller first opening OP1 of the lid structure 500 may maintain the stress alleviating effect, but the heat dissipation effect might be slightly reduced.

Figure 17:
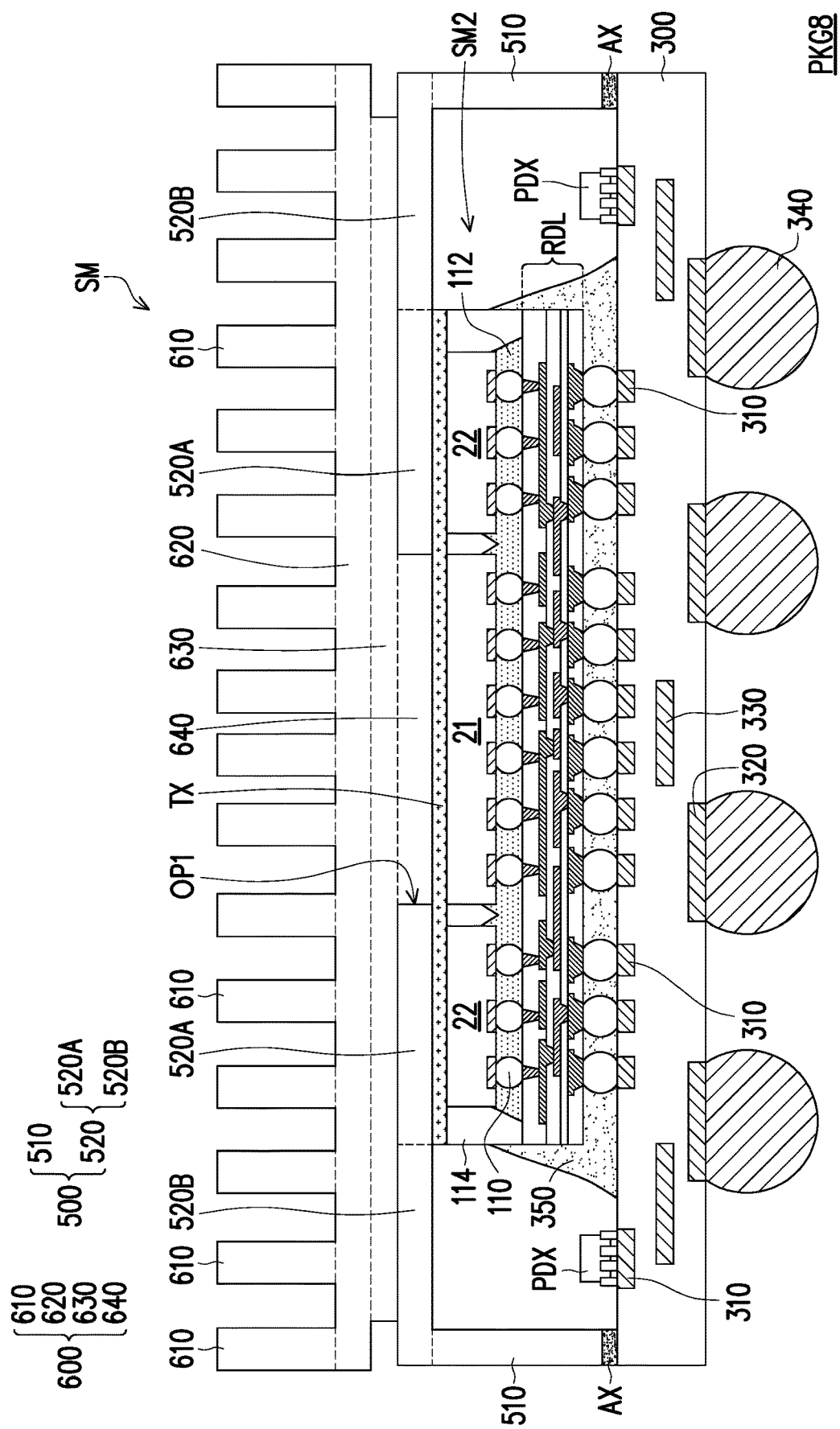
FIG. 17 is a schematic sectional view of a package structure according to some other exemplary embodiments of the present disclosure.

FIG. 17 is a schematic sectional view of a package structure according to some other exemplary embodiments of the present disclosure. The package structure PKG8 illustrated in FIG. 17 is similar to the package structure PKG1 illustrated in FIG. 5A. Therefore, the same reference numerals are used to refer to the same or liked parts, and its detailed description will be omitted herein. The difference between the embodiments is that the semiconductor package SM2 in FIG. 2 is used in replacement of the semiconductor package SM in FIG. 5A. The details of the semiconductor package SM2 may be referred to the descriptions of FIG. 2, thus will not be repeated herein. In the previous embodiments, the various designs of the lid structure 500 and heat dissipation structure 600 are applied to the semiconductor packages SM/SM' as examples. However, the disclosure is not limited thereto. For example, the various designs of the lid structure 500 and heat dissipation structure 600 may also be applied and disposed over the semiconductor package SM2 to achieve the same stress alleviating effect and heat dissipation effect, while controlling the warpage of the package structure.

In the above-mentioned embodiments, the package structure includes a lid structure having a supporting part that is partially covering and in physical contact with the thermal interface material, and a heat dissipation structure disposed on the supporting part of the lid structure. As such, the stress or force induced on the package may be alleviated, while the warpage of the package structure may also be appropriately controlled. Overall, the reliability of the package structure may be enhanced.

In accordance with some embodiments of the present disclosure, a package structure includes a circuit substrate, a semiconductor package, a thermal interface material, a lid structure and a heat dissipation structure. The semiconductor package is disposed on and electrically connected to the circuit substrate. The thermal interface material is disposed on the semiconductor package. The lid structure is disposed on the circuit substrate and surrounding the semiconductor package, wherein the lid structure comprises a supporting part that is partially covering and in physical contact with the thermal interface material. The heat dissipation structure is disposed on the lid structure and in physical contact with the supporting part of the lid structure.

In accordance with some other embodiments of the present disclosure, a package structure includes a circuit substrate, an interposer structure, a plurality of semiconductor dies, an insulating encapsulant, a lid structure and a heat dissipation structure. The interposer structure is disposed on and electrically connected to the circuit substrate. The semiconductor dies are disposed on a first surface of the interposer structure and electrically connected to the interposer structure. The insulating encapsulant is disposed on the first surface of the interposer structure and surrounding the semiconductor dies. The lid structure is disposed on the circuit substrate and surrounding the interposer structure and the semiconductor dies, wherein the lid structure comprises a first opening that is partially overlapped with the semiconductor dies. The heat dissipation structure is disposed on the lid structure, wherein the heat dissipation structure comprises a protruding portion that fills into the first opening of the lid structure.

In accordance with yet another embodiment of the present disclosure, a package structure includes a circuit substrate, an interposer structure, a plurality of first semiconductor dies, a plurality of second semiconductor dies, a lid structure and a heat dissipation structure. The interposer structure is disposed on the circuit substrate. The first semiconductor dies are disposed over a central region of the interposer structure. The second semiconductor dies are disposed over a peripheral region of the interposer structure aside the first semiconductor dies. The lid structure is disposed on the circuit substrate and surrounding the interposer structure, the first semiconductor dies and the second semiconductor dies, wherein the lid structure comprises a supporting part that covers the peripheral region while revealing the central region of the interposer structure. The heat dissipation structure is disposed on the lid structure, wherein the heat dissipation structure comprises a protruding portion surrounded by the supporting part of the lid structure, and an area of a top surface of the protruding portion substantially corresponds to an area occupied by the first semiconductor dies over the central region of the interposer structure.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a circuit substrate;
   a semiconductor package disposed on and electrically connected to the circuit substrate;
   a thermal interface material disposed on the semiconductor package;
   a lid structure disposed on the circuit substrate and surrounding the semiconductor package, wherein the lid structure comprises a supporting part that is partially covering and in physical contact with the thermal interface material; and
   a heat dissipation structure disposed on the lid structure and in physical contact with the supporting part of the lid structure, wherein the heat dissipation structure is a heat sink comprising:
      fin structures;
      a fin base supporting the fin structures;
      a step structure supporting the fin base; and
      a protruding portion disposed on the step structure, wherein the protruding portion is in physical contact with the thermal interface material.

2. The package structure according to claim 1, wherein the protruding portion is surrounded by the supporting part of the lid structure.

3. The package structure according to claim 1, wherein a width of the step structure is smaller than a width of the fin base, and a width of the protruding portion is smaller than the width of the step structure.

4. The package structure according to claim 1, wherein the thermal interface material comprises a first thermal interface material having a heat transfer coefficient of greater than 20 W/mK, and a second thermal interface material having a heat transfer coefficient of greater than 3 W/mK and less than 20 W/mK, and wherein the second thermal interface material is surrounding the first thermal interface material.

5. The package structure according to claim 1, wherein the lid structure further comprises:
a sidewall part disposed on the circuit substrate and surrounding the semiconductor package, and wherein the supporting part is disposed on and in physical contact with the sidewall part.

6. The package structure according to claim 5, wherein the lid structure further comprises:
a supporting bar disposed on and protruding out from the supporting part, wherein the supporting bar is surrounding and in physical contact with a portion of the heat dissipation structure.

7. The package structure according to claim 1, wherein the fin structures has a height of H1, the fin base has a height of H2, the step structure has a height of H3, and the protruding portion has a height of H4, and wherein H2, H3 and H4 are smaller than H1.

8. The package structure according to claim 7, wherein a thickness TH of the thermal interface material is smaller than the heights H1, H2, H3 and H4.

9. A package structure, comprising:
a circuit substrate;
an interposer structure disposed on and electrically connected to the circuit substrate;
a plurality of semiconductor dies disposed on a first surface of the interposer structure and electrically connected to the interposer structure;
an insulating encapsulant disposed on the first surface of the interposer structure and surrounding the plurality of semiconductor dies;
a lid structure disposed on the circuit substrate and surrounding the interposer structure and the plurality of semiconductor dies, wherein the lid structure comprises a first opening that is partially overlapped with the plurality of semiconductor dies; and
a heat dissipation structure disposed on the lid structure, wherein the heat dissipation structure comprises a protruding portion that fills into the first opening of the lid structure, and further comprises a concaved portion surrounding the protruding portion,
and wherein the lid structure further comprises a supporting bar protruding towards the concaved portion to surround the protruding portion.

10. The package structure according to claim 9, further comprising a thermal interface material disposed in between the plurality of semiconductor dies and the heat dissipation structure, wherein the protruding portion that fills into the first opening is in physical contact with the thermal interface material.

11. The package structure according to claim 10, wherein the thermal interface material comprises a first thermal interface material having a heat transfer coefficient of greater than 20 W/mK, and a second thermal interface material having a heat transfer coefficient of greater than 3 W/mK and less than 20 W/mK, wherein the second thermal interface material is surrounding the first thermal interface material, and the protruding portion is in physical contact with the first thermal interface material.

12. The package structure according to claim 9, wherein the lid structure further comprises a plurality of sectioning parts defining a plurality of sub-openings in the first opening, and wherein a dimension of the plurality of sub-openings corresponds to a dimension of the plurality of semiconductor dies.

13. The package structure according to claim 9, wherein the plurality of semiconductor dies comprises a plurality of first semiconductor dies and a plurality of second semiconductor dies, the first opening is overlapped with the plurality of first semiconductor dies, and non-overlapped with the plurality of second semiconductor dies.

14. The package structure according to claim 13, wherein the plurality of first semiconductor dies are logic dies, and the plurality of second semiconductor dies are memory dies.

15. The package structure according to claim 9, wherein the first opening has a width of WC1 and a length of LC1, and the width WC1 and the length LC1 corresponds to a sum of the widths and a sum of the lengths of two of the plurality of semiconductor dies located over a central region of the package structure.

16. A package structure, comprising:
a circuit substrate;
an interposer structure disposed on the circuit substrate;
a plurality of first semiconductor dies disposed over a central region of the interposer structure;
a plurality of second semiconductor dies disposed over a peripheral region of the interposer structure aside the plurality of first semiconductor dies;
a lid structure disposed on the circuit substrate and surrounding the interposer structure, the plurality of first semiconductor dies and the plurality of second semiconductor dies, wherein the lid structure comprises a supporting part that covers the peripheral region while revealing the central region of the interposer structure; and
a heat dissipation structure disposed on the lid structure, wherein the heat dissipation structure comprises a protruding portion surrounded by the supporting part of the lid structure,
and wherein the protruding portion comprises a plurality of protruding sub-portions, and an area of a top surface of each of the plurality of protruding sub-portions substantially corresponds to an area occupied by each of the plurality of first semiconductor dies over the central region of the interposer structure.

17. The package structure according to claim 16, wherein the heat dissipation structure is a heat sink comprising:
fin structures;
a fin base supporting the fin structures;
a step structure supporting the fin base; and
the protruding portion disposed on the step structure, wherein a height of the protruding portion is smaller than a height of the fin structures.

18. The package structure according to claim 16, further comprising a thermal interface material disposed in between the plurality of first semiconductor dies and the heat dissipation structure, and in between the plurality of second semiconductor dies and the heat dissipation structure, wherein the protruding portion is in physical contact with the thermal interface material.

19. The package structure according to claim 18, wherein the thermal interface material comprises:
a first thermal interface material in physical contact with the plurality of first semiconductor dies and the protruding portion of the heat dissipation structure; and a second thermal interface material in physical contact with the plurality of second semiconductor dies and the supporting part of the lid structure.

20. The package structure according to claim 16, wherein the lid structure further comprises a plurality of sectioning parts joined with the supporting part, and separating the plurality of protruding sub-portions from one another.

* * * * *